(12) United States Patent
Horie

(10) Patent No.: US 6,677,869 B2
(45) Date of Patent: Jan. 13, 2004

(54) ARITHMETIC CODING APPARATUS AND IMAGE PROCESSING APPARATUS

(75) Inventor: Hitoshi Horie, Ageo (JP)

(73) Assignee: Panasonic Communications Co., Ltd., Fukuoka (JP)

( * ) Notice: Subject to any disclaimer, the term of this patent is extended or adjusted under 35 U.S.C. 154(b) by 0 days.

(21) Appl. No.: 10/046,764

(22) Filed: Jan. 17, 2002

(65) Prior Publication Data

US 2002/0114529 A1 Aug. 22, 2002

(30) Foreign Application Priority Data

Feb. 22, 2001 (JP) ........................................ 2001-047068
Jan. 9, 2002 (JP) ........................................ 2002-002818

(51) Int. Cl.⁷ ........................... G06K 9/36; G06K 9/46; H03M 7/40; H03M 7/00
(52) U.S. Cl. ........................... 341/107; 341/67; 382/247
(58) Field of Search ................ 382/166, 232, 382/246, 239; 341/67, 81, 107; 712/200, 300, 34; 348/402.1, 403.1; 358/426.11; 375/240.01, 240.03, 240.12, 240.2, 240.18

(56) References Cited

U.S. PATENT DOCUMENTS 5,473,377 A * 12/1995 Kim .................... 375/240.03
5,589,829 A * 12/1996 Astle .......................... 341/67
5,654,702 A * 8/1997 Ran ............................ 341/51
5,867,600 A * 2/1999 Hongu ...................... 382/247

FOREIGN PATENT DOCUMENTS

| JP | 7-249995 | 9/1995 |
| JP | 11289461 | 10/1999 |
| JP | 2000-115549 | 4/2000 |
| JP | 2000-278538 | 10/2000 |
| JP | 2000-350043 | 12/2000 |
| JP | 2001-189661 | 7/2001 |

OTHER PUBLICATIONS

English Language Abstract of JP 7–249995.
English Language Abstract of JP 2000–115549.
English Language Abstract of JP 2000–278538.
English Language Abstract of JP 2001–189661.
English Language Abstract of JP 2000–350043.
English Language Abstract of JP 11–289461.

* cited by examiner

Primary Examiner—Patrick Wamsley
(74) Attorney, Agent, or Firm—Greenblum & Bernstein, P.L.C.

(57) ABSTRACT

An arithmetic coding apparatus for carrying out complete pipeline processing is provided. This arithmetic coding apparatus analyzes an input image, reads image information accurately and performs arithmetic coding at ultra-high speed. Using a future prediction type Qe memory removes disturbance in the pipeline caused by renormalization. The arithmetic coding apparatus also generates a common context when coding multi-valued images without distinguishing between an AC component and DC component of a DCT coefficient. The apparatus is also provided with a circuit for outputting an arithmetic code which is a variable-length code with the length fixed to facilitate editing of a reconstructed image.

14 Claims, 21 Drawing Sheets

| ADDRESS | 62 | 46 | 30 | 14 | 7 | 0 |
|---|---|---|---|---|---|---|
| | Qe | next Qe (LPS) | next Qe (MPS) | next state | next state | switch |
| 0 | 0x5a1d | 0x2586 | 0x2586 | 0000001 | 0000001 | 1 |
| 1 | 0x2586 | 0x5a7f | 0x1114 | 0001110 | 0000010 | 0 |
| 2 | 0x1114 | 0x17b9 | 0x080b | 0010000 | 0000011 | 0 |
| ... | | | | | | |
| 112 | 0x59eb | 0x59eb | 0x5522 | 1110000 | 1101111 | 1 |

FIG. 5

|  | DC COMPONENT | AC COMPONENT |  |
|---|---|---|---|
| SYMBOL | $T_{00}, T_{01}, ..., T_{0i}$ | $T_{10}, T_{11}, ..., T_{1i}$ | ...... |
| CONTEXT | $S_{00}, S_{01}, ..., S_{0i}$ | $S_{10}, S_{11}, ..., S_{1i}$ | ...... |

CONTEXT TREE $S_i$

ARITHMETIC CODING APPARATUS AND IMAGE PROCESSING APPARATUS

BACKGROUND OF THE INVENTION

1. Field of the Invention

The present invention relates to an arithmetic coding apparatus and image processing apparatus.

2. Description of the Related Art

An arithmetic coding system that predicts a coding symbol based on states of already coded pixels and carries out arithmetic coding on the prediction result based on a probability estimate of the coding symbol determined for each state is known to have the most excellent characteristic in terms of compressibility.

A QM-coder, a coder adopted by JBIG (ITU Recommendation T.82), is a typical example of an apparatus for carrying out arithmetic coding.

A general configuration and operation of the QM-coder, which is an arithmetic coder for binary images, will be explained below.

As shown in FIG. 18, the QM-coder comprises context generation section 200, context table (context memory) 210, probability estimator 220 and arithmetic coder 230.

Context generation section 200 detects 1024 states created by 10 pixels surrounding to a coding pixel. FIG. 20 shows an example of a template.

"?" in the figure is the coding pixel and the 10 pixels marked "x" are reference pixels. When coding of one pixel is completed, the template is shifted by one rightward as shown with dotted line in FIG. 20 and coding of the next pixel is performed.

Each of 1024 states determined by the values of 10 pixels is called "context" (hereinafter expressed with "S"). A predicted value of a more probable symbol MPS(s) (that is, if MPS of the coding pixel is predicted as "1" by the context s, MPS(s)=1) and a state number of the probability estimator are read from context memory for each context and output to probability estimator 220.

Probability estimator 220 outputs interval width of a less probable symbol Qe(s) to arithmetic coder 230 based on this information. Here, "Qe" is a probability that LPS will occur and the present specification sometimes refers to Qe as a "symbol occurrence probability" or simply as a "probability estimate".

Furthermore, interval width of a less probable symbol Qe(s) means the width corresponding to the probability of occurrence of LPS which is calculated by multiplying the probability of occurrence of LPS by the width of an augend. The augend refers to the overall width of a number line shown in FIG. 19.

Arithmetic coder 230 performs arithmetic coding calculations based on the coding symbol, predicted value of MPS(S), and interval width Qs(s), and outputs code stream.

As shown in FIG. 19, arithmetic coding divides a number line of initial value 0 to 1 into two sub-intervals of a more probable symbol (MPS) and a less probable symbol (LPS). A series of coding symbols is associated with a point (a coding point) some where within each sub-interval. For the simplicity, the QM-coder uses the convention that the coding point is located at the bottom of the sub-interval.

When a coding symbol matches a predicted value, an MPS width is selected for coding of the symbol and an LPS width is selected otherwise.

As described above, a coding point is provided in this sub-interval and a binary fraction of the point denotes an arithmetic code stream.

When the interval width falls short of a predetermined value, an arithmetic coding calculation repeats the doubling operation until the interval width exceeds a predetermined value (more specifically ½ of the initial value) to maintain the accuracy of decimal points. This processing is called "renormalization".

Renormalization is also carried out when LPS is coded. That is, when an LPS width is selected as a result of estimation failure, the LPS width is always smaller than ½ of the initial value and therefore renormalization is performed every time.

When renormalization is performed, the MPS value and state number (ST) in context table 210 in FIG. 18 are updated. The state number is updated when the "next state number" written in probability estimation section 220 is overwritten in context table 210. In FIG. 18, this overwrite is indicated by an arrow RX.

With this update of the context table 210, even if the next context is also the same as the previous context (that is, even if the template in FIG. 20 is shifted by one rightward, the positions of 1 and 0 of the reference pixels are the same as the previous positions), the value of Qe(S) that occurs is different.

In this way, a Qe (S) value suitable for a probability distribution of the information source is selected. That is, the coding parameter Qe (s) is more adapted to the target image.

Here, the coding target is not limited to binary data. Multi-valued data such as continuous-tone image can also be coded using the QM-coder. However, it is necessary to use a context model which matches the coding target.

For example, a discrete cosine transform coefficient (DCT coefficient) includes a DC component and AC component. The both components have different natures of signal. Therefore, it is important to construct a context model suited to these natures in improving the coding efficiency.

In the current technology, different contexts are created for the DC component and AC component.

The conventional arithmetic coding processing has the following problems.

(Problem 1)

Originally, arithmetic coding is excellent in compressibility, but since it is necessary to repeat generation of a context, estimation of symbol occurrence probability and arithmetic code calculation symbol by symbol, arithmetic coding has a disadvantage that it requires a long processing time. A reduction of the processing speed is quite a big problem in such a field as a digital copier that requires high image quality and high speed processing.

Furthermore, when arithmetic coding is pipelined, if renormalization occurs at some midpoint, disturbance occurs with the pipeline resulting in an increase of useless wait time. The processing efficiency may reduce in this way. Especially, renormalization occurs with considerable frequency and pipeline disturbance is likely to occur in image patterns whose context has continuity. The same problem may also occur in the case of decoding.

Therefore, even if arithmetic coding is pipelined, the accuracy cannot be said to be high and speeding up of arithmetic coding/decoding is not expected much.

(Problem 2)

It is desirable to carry out high accuracy pipeline processing in the case of not only coding of binary data but also coding or decoding of multi-valued data (e.g., numerical data such as orthogonal transform coefficient, etc. obtained by JPEG compression).

However, high-speed arithmetic coding or decoding of numerical values such as orthogonal transform coefficients involves the following problems.

That is, making pipeline processing effectively requires data necessary for the next pipeline stage to be supplied continuously at a constant rate.

For example, performing high-speed decoding requires context indices to be supplied simultaneously to a plurality of symbols which are likely to be reconstructed. A set of these context indices will be called "context index vector".

It is actually difficult to supply context data of such a vector format at a constant rate. As described above, an orthogonal transform coefficient includes a DC component and AC component. Since the DC component and AC component have statistically different natures, the current technology provides different contexts for the respective components.

It is difficult to supply different contexts consecutively. Thus, when DC components and AC components are mixed in a plurality of symbols to be coded, it is difficult to supply a context index vector at a constant rate.

Therefore, high-speed arithmetic coding of multi-valued data is more difficult than in the case of binary data.
(Problem 3)

It would be convenient if it is possible to divide an input image into blocks of a predetermined size, apply arithmetic coding block by block independently and freely perform decoding in block units.

However, since an arithmetic code is a variable-length code, the code length of a code corresponding to one block is not constant. Therefore, when arithmetic-coded image data is reconstructed and the orientation of the image is changed for only some blocks, it is difficult to find pixel data at the start of the target block.

In view of these situations, it is an object of the present invention to implement ultra-high-speed and high compressibility arithmetic coding or decoding irrespective of binary data or multi-valued data, and coordinate the amount of arithmetic coding per block to a fixed value and simplify the subsequent processing.

SUMMARY OF THE INVENTION (1) When a coding parameter needs to be updated, the arithmetic coding apparatus of the present invention outputs a probability estimate (future probability estimate) which is expected to be output after the parameter is updated in parallel with the current estimated value (probability estimate output through normal processing). Then, when a predetermined situation occurs (for example, a parameter needs to be updated and contexts are generated consecutively and therefore contention occurs between writes and reads of RAM), a future estimated value rather than the current estimated value is supplied to the coder. This eliminates the need to wait for coding while updating parameters by carrying forward the loop, thus preventing disturbance in the pipeline.

(2) The present invention discards the conventional fixed concept that attaches absolute importance to compressibility and introduces a new concept that attaches primary importance to the processing speed. Based on this concept, the present invention positively use contexts common to both the DC component and AC component.

Then, the present invention makes it possible to generate context indices using a state transition table for both coding and decoding.

This makes it easier to generate a context index vector during decoding and implement a coder or decoder suitable for pipeline processing. Since the coding context is simplified, the compression performance deteriorates more or less. However, the present invention analyzes information of an input image accurately through image area decision or layering processing, etc. and performs high precision compression, causing no problem in this respect.

Furthermore, it is often the case that higher priority is given to the processing speed than the image quality, causing no practical problem.

The present invention can perform arithmetic coding or arithmetic decoding for both binary images and multi-valued images flexibly and at the same time at a rate almost close to the limit rate determined by an arithmetic coding algorithm.

Moreover, since the present invention performs coding or decoding using a common context without distinguishing between bi-level images and multi-valued images and can thereby extremely simplify the configurations of the coder or decoder, too.

(3) Furthermore, the present invention temporarily stores arithmetic codes in memory and always reads data of predetermined bytes from the memory, and can thereby fix the code length of one block.

This makes it possible to simplify the processing of partially reconstructing images in block units, etc.

BRIEF DESCRIPTION OF THE DRAWINGS

The above and other objects and features of the invention will appear more fully hereinafter from a consideration of the following description taken in connection with the accompanying drawing wherein one example is illustrated by way of example, in which;

FIG. 5 illustrates a configuration example of a probability estimation memory of the present invention;

DETAILED DESCRIPTION OF THE PREFERRED EMBODIMENTS

Figure 1:
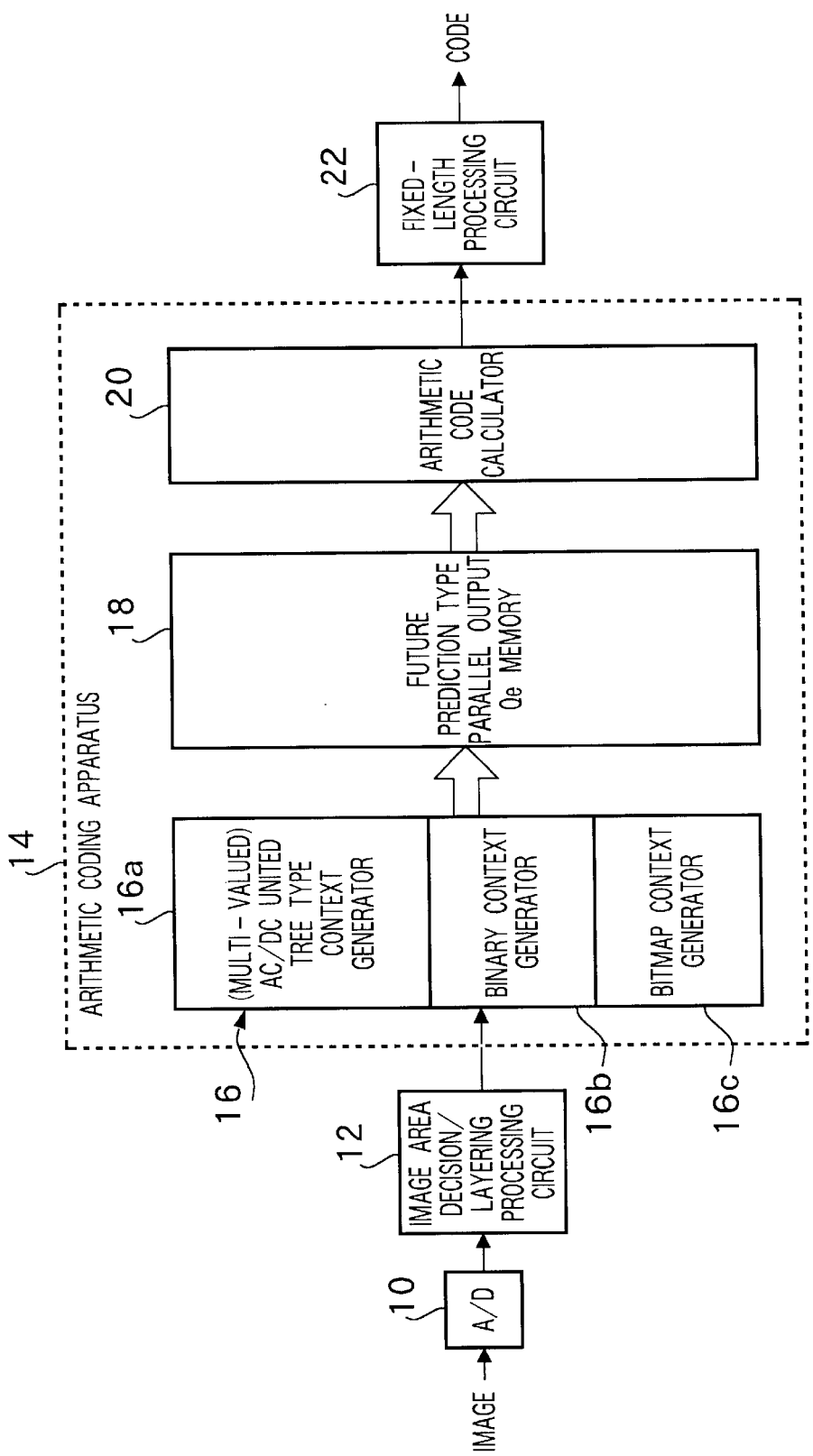
FIG. 1 illustrates an overall configuration of an example of an arithmetic coding apparatus of the present invention.

FIG. 1 outlines an overall configuration of an example of an arithmetic coding apparatus of the present invention.

As shown in FIG. 1, the arithmetic coding apparatus of the present invention converts an image signal to digital data through A/D converter 10, and then applies image area decision and layering processing using image area decision/layering processing section 12.

Image area decision is performed in tile (macro block: e.g., 32 pixels×32 pixels) units.

Layering processing is processing of grouping all pixels included in one tile into, for example, a foreground (FG) and background (BG). Such processing allows information of an input image to be acquired accurately.

The acquired image information is subjected to arithmetic coding by completely pipelined arithmetic coding apparatus 14.

When a predicted value is different from the actual value, the arithmetic coder outputs a code as a penalty and rewrites a context RAM. Therefore, when the context RAM is rewritten, the pipeline is inevitably disturbed.

The present invention solves this problem by adopting a system of outputting a future predicted value in parallel and using a common context without distinguishing between an AC component and DC component of a DCT coefficient.

This implements hazardless, complete pipeline processing. This allows codes corresponding to one pixel to be generated consecutively in synchronization with one clock.

Arithmetic coding apparatus 14 includes context generator 16 (also including context RAM), future prediction type parallel output Qe memory 18 and arithmetic code calculator 20.

Context generator 16 is characterized by creating a common context according to a unified tree structure without distinguishing between an AC component and DC component when creating a multi-valued context.

Fixed-length processing circuit 22 forcibly arranges the code length of one block (e.g., block as a unit of DCT transformation) of a code output from the arithmetic code calculator to a predetermined size.

Fixing the code length of each block makes it easier to edit a reconstructed image in block units.

Generally speaking, fixing the length of a code may cause a loss of information and slightly degrade the quality of the reconstructed image.

However, the present invention acquires image data information with high accuracy, compresses the image data information with high accuracy using an arithmetic coder and thereby provides information of intrinsically high quality.

This eliminates the possibility of the quality of a reconstructed image degrading due to fixed-length processing.

Figure 2:
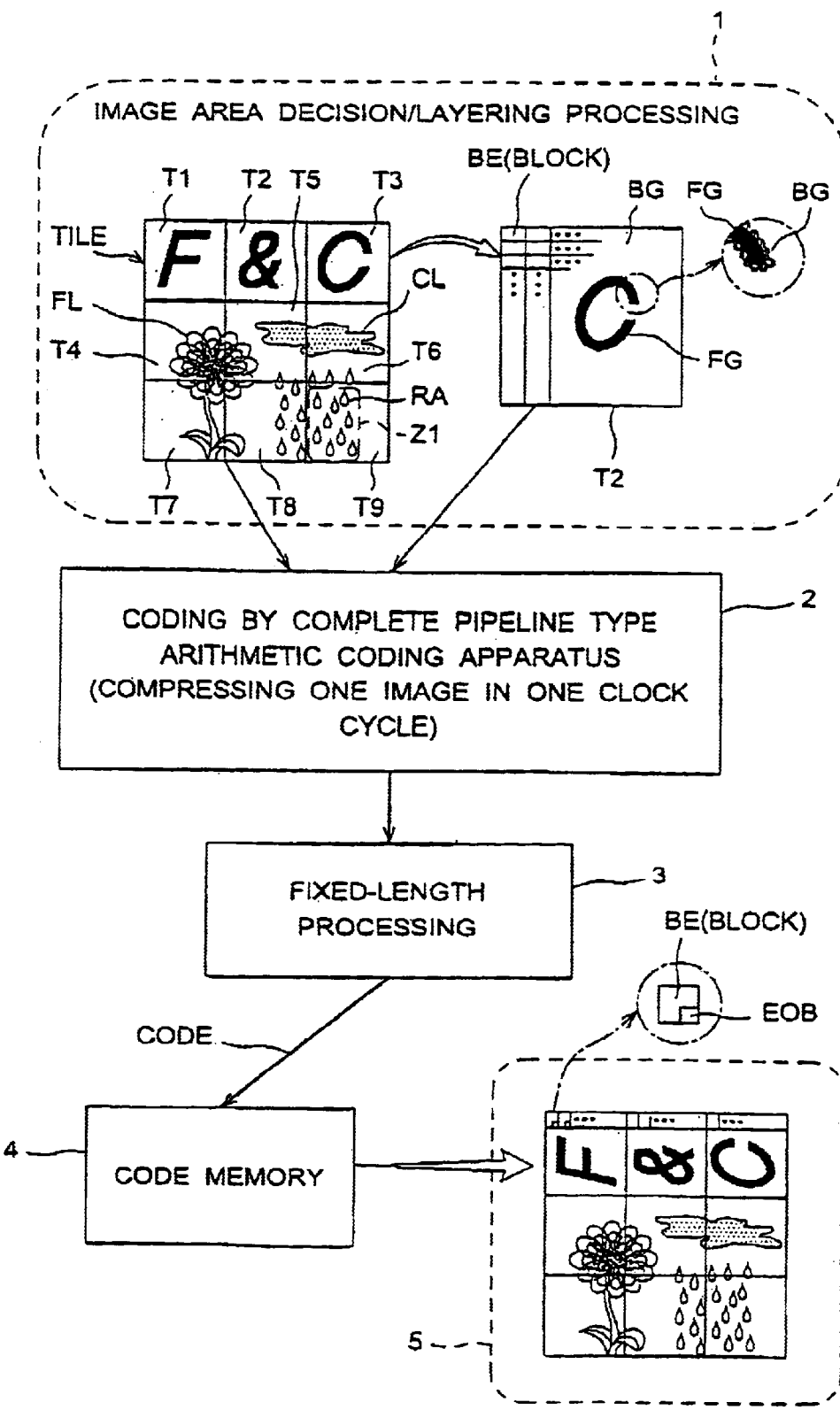
FIG. 2 illustrates features of the arithmetic coding apparatus in FIG. 1.

FIG. 2 shows major features of the arithmetic coding apparatus of the present invention described above.

The image area decision/layering processing divides an image into tiles (macro blocks) T1 to T9 and groups pixels included in each tile into a background (BG) and foreground (FG).

A tile has a size of 32 pixels×32 pixels, for example, and consists of a set of 16 blocks (micro blocks: 8 pixels×8 pixels) BE, which become the bases of DCT transformation.

Then, the complete pipeline type arithmetic coding apparatus carries out coding (process 2). Arithmetic coding is performed for each block BE.

That is, when coding of one block BE is completed, EOB indicating the end of coding is added at the end, the arithmetic coder is initialized and the next block is coded.

Then, fixed-length processing (process 3) is performed. This arranges the code length of one block to a certain length.

Codes are temporarily stored in code memory 4. Then, the image is reconstructed through decoding processing (process 5).

At this time, processing such as partially changing the orientation of the image may be performed block by block. Since the code length of each block is fixed, it is possible to easily find the position of the codeword which includes the start pixel of a target image block. Thus, the present invention makes it easier to edit a reconstructed image.

Figure 3:
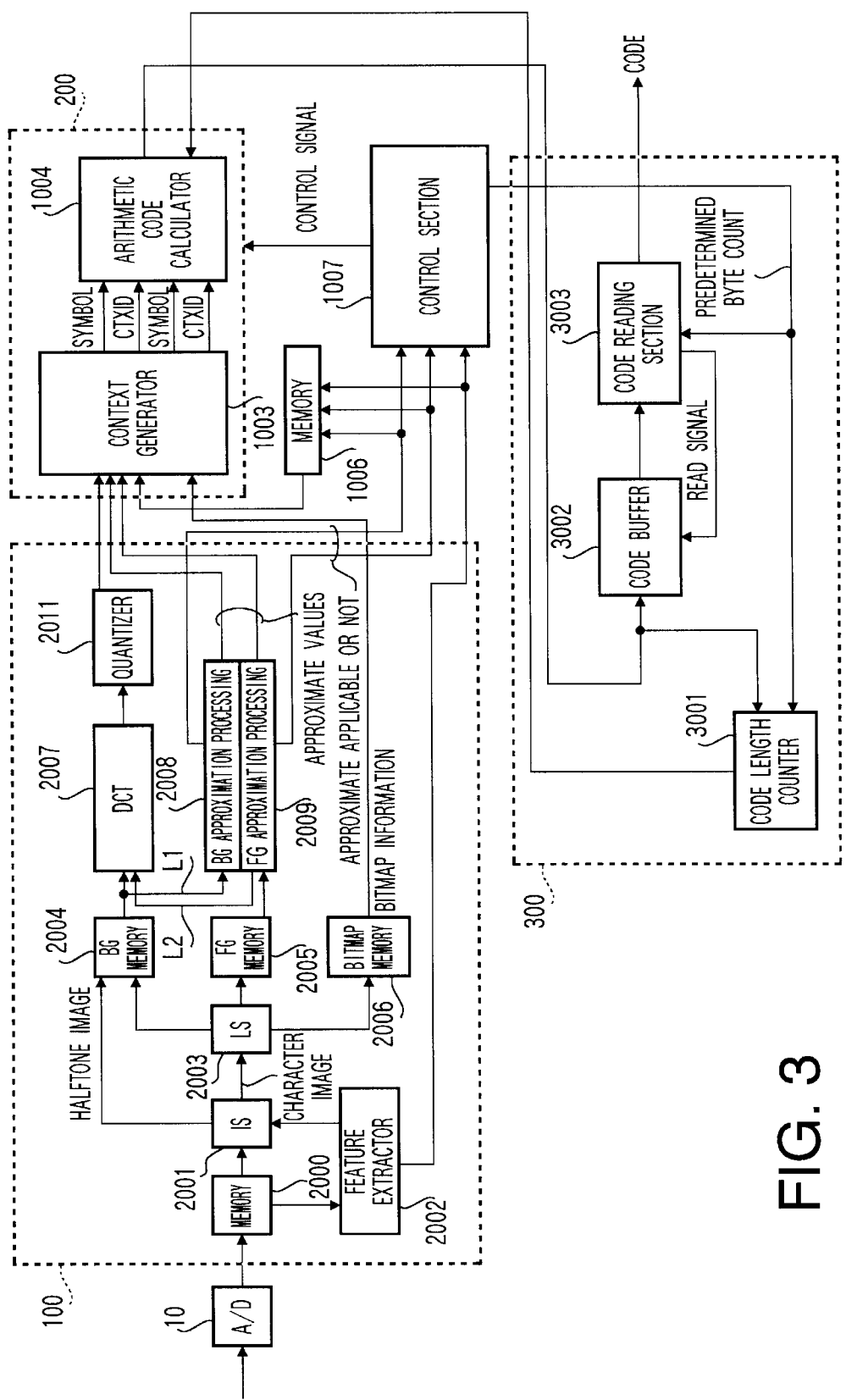
FIG. 3 is a block diagram showing an example of a specific configuration of the arithmetic coding apparatus of the present invention.

FIG. 3 is a block diagram showing an example of a more specific configuration of the arithmetic coding apparatus of the present invention.

The image data is sent to a section (layer separation/approximation processing section) 100 that carries out layer separation, approximation, orthogonal transformation or quantization.

Layer separation/approximation processing section 100 comprises tile memory 2000, image area separation section 2001, feature extractor 2002, layer separation section 2003, BG (background) memory 2004, FG (foreground) memory 2005, bitmap memory 2006, orthogonal transformer (DCT) 2007, BG approximation processor 2008, FG approximation processor 2009, quantization table 2010, multiplier 212 and quantizer 2011.

The approximated or quantized image data, flag information indicating the tile image area decision result, bitmap data indicating whether each pixel in a tile belongs to the background (BG) or foreground (FG), and flag information indicating whether approximation processing has been applicable or not are coded by arithmetic coder (variable-length coder) 200.

Memory 1006 in arithmetic coder 200 is the memory to temporarily store flag information indicating the tile image area decision result and flag information indicating whether approximation processing has been applicable or not.

Furthermore, the operation of arithmetic coder 200 is controlled by control section 1007 in a centralized manner.

Codes output from arithmetic code calculator 1004 are temporarily stored in code buffer 3002 in fixed-length processing section 300. This code buffer is all cleared to zero prior to coding of one block.

Code reading section 3003 reads data from code buffer 3002 every time codes corresponding to a predetermined number of bytes (codes of one block) are stored.

In the case where the code length falls short of the predetermined number of bytes, data with "0" which is an initial value of code buffer 3002 added at the end of the code is automatically read.

This eliminates the need for troublesome processing of intentionally inserting zeros and fixing the length of the code.

The code length counter totalizes code lengths and detects whether the total value has reached a predetermined number of bytes or not and instructs arithmetic code calculator 1004 to end the coding.

This is the overview of the arithmetic coding apparatus of the present invention.

Hereinafter, specific configuration and features of the components of the apparatus of the present invention will be explained one by one with reference to the attached drawings.

First, pipeline arithmetic coding of binary data will be explained with reference to FIG. 4 to FIG. 7.
(Arithmetic Coding Processing of Binary Data)

Figure 4:
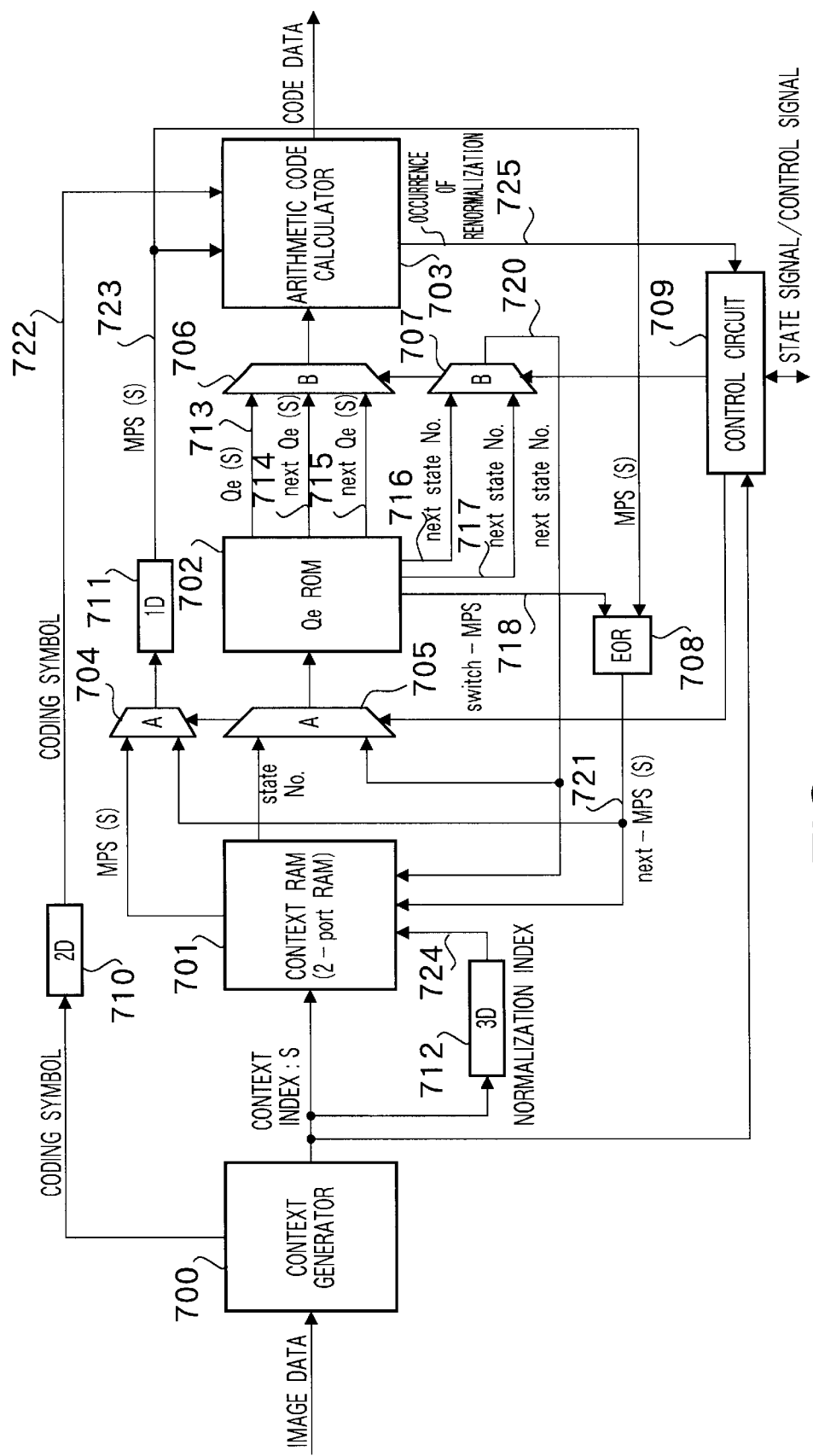
FIG. 4 is a block diagram showing an overall configuration of a hazardless pipeline arithmetic coder of the present invention.

FIG. 4 is a block diagram showing a configuration of an arithmetic coder according to Embodiment 1 of the present invention.

As shown in FIG. 4, the coder comprises context generator 700, context table (context RAM) 701, probability estimator (Qe ROM) 702 and arithmetic code calculator 703, each of which executes one process on one clock. That is, the arithmetic coder in FIG. 4 has a pipeline structure.

The basic processing contents of these components are the same as those of the conventional example.

This embodiment features the Qe ROM configuration and circuit configuration of the parts peripheral thereto.

The content of the table mounted on Qe ROM 702 is as shown in FIG. 5. The table in FIG. 5 is characterized in that data such as "next Qe (LPS)" and "next Qe (MPS)" are added to the conventional table data.

Thus, the table in FIG. 5 has a width of 63 bits and has more bits than the conventional table.

Here, "next Qe (MPS)" refers to the width (Qe) of LPS which would be output from Qe ROM 702 when arithmetic coder 703 carries out coding of MPS resulting in the augend falling short of ½ of the initial value causing renormalization to occur, the state of the transition target of context ROM 701 is updated, the next symbol to be coded is the same context, and thereby access is made to the same address of context RAM 701 as that of the previous access, making access to the address corresponding to the state of the updated transition target as a result.

Likewise, "next Qe (LPS)" refers to the width (Qe) of LPS which would be output from Qe ROM 702 when arithmetic coder 703 carries out coding of LPS, causing renormalization to inevitably occur, the loop is turned in response thereto to update the context table and the same address is accessed.

That is, this embodiment is characterized by putting in the table of Qe ROM 702 beforehand together with the current value of Qe a future value of Qe which would be generated when renormalization occurs, the table in context RAM 701 is updated and the completely the same address is accessed again.

All kinds of information such as contexts of symbols to be coded or whether renormalization occurs or not in the arithmetic coder is input to control circuit 709 in FIG. 4.

Therefore, control circuit 709 can select the current Qe, future Qe (MPS) or Qe (LPS) from the information in real time. Selector 706 is provided to allow such a selection.

Thus, even if renormalization occurs, it is not necessary to wait for processing while turning the loop and updating the table, but it is only necessary to use the selector to select future Qe (MPS) or Qe (LPS). This prevents disturbance in the pipeline.

Selectors 704 and 705 are provided so that the previously used MPS value and the number of the state of the transition target can be reused considering the possibility of recurrence of the renormalization after renormalization occurs.

This embodiment will be explained more specifically below.

A state number of the state transition table is input to Qe ROM 702 as an address. As for an output signal, the current probability estimate Qe(s) (signal 713) and a new Qe (S) when a state transition takes place because of renormalization are output as signal 714 and signal 715 for LPS renormalization and MPS renormalization respectively, two kinds of state transition number (signal 716 and signal 717) due to renormalization are output likewise and a flag (switch-MPS, signal 718) indicating whether MPS (S) should be inverted or not is output.

This flag and the current predicted symbol MPS (S) are exclusive-ORed by EOR circuit 708 to create a new predicted symbol. This value and the output of selector 707 become index 724 to be renormalized.

When the symbol to be coded immediately after renormalization occurs is coded with the same context, selectors 704 and 705 select the signal on the downside. That is, MPS for updating to be overwritten in context RAM 701 and the next state number are selected.

In such a case, since there is a possibility that the next probability estimation will also fail and renormalization will continue, MPS for updating and the next state number are reused.

In this case, Qe ROM 702 is accessed with the state number output through selector 705 used as an address variable and Qe 713, next Qe 714 and 715 with the same values as the previous ones are output in parallel and one of these is selected when the coding result is obtained.

Control circuit 709 outputs a selection signal of each selector as appropriate while monitoring a necessary state signal. To avoid complexity in the drawing, details of control signals are omitted.

FIG. 5 shows a configuration example of Qe ROM.

As described above, disturbance occurs in the pipeline because Qe ROM needs to be read again.

To eliminate the need to re-read Qe ROM in this case, this embodiment stores transition target Qe during LPS renormalization and transition target Qe during MPS renormalization at the same address. Bit 15 to bit 46 correspond to this part.

The state transition table shows that when Qe-index is 0, the transition target (Qe-index) of MPS renormalization or LPS renormalization is 1. The table also shows that when Qe-index is 1, Qe is 0×2586.

By doing so, re-reading of ROM is unnecessary even when coding of the same context is performed immediately after renormalization occurs and it is only necessary to select the necessary data pieces from a plurality of already read data pieces according to the situation.

Then, an overview of an operation of the arithmetic coder in FIG. 4 will be explained with reference to FIG. 6.

Coding of the ith symbol is processed in the order of generation of a context (context det), reading of context RAM (context RAM RD), reading of Qe ROM (Qe RD), coding calculation and renormalization calculation (coding/renorm) in synchronization with a clock.

Context detector 700 detects a symbol to be coded and the context thereof. The symbol to be coded is sent to arithmetic coding calculator 703 through delay circuit 710 for timing adjustment of the pipeline.

Context index "s" which is the context ID number becomes an input signal for context RAM 701. When renormalization occurs with that context simultaneously, context index "s" is input to renormalization index 712 as the address information to update the content of the RAM.

Renormalization index 712 is a delay circuit to give a delay corresponding to 3 clocks.

Output signal 724 of renormalization index 712 becomes a signal (context index) to specify the address which includes the next transition state or MPS value to be updated, when renormalization occurs.

Context RAM 701 is constructed of a dual port RAM that can perform a read and write simultaneously.

Figure 20:
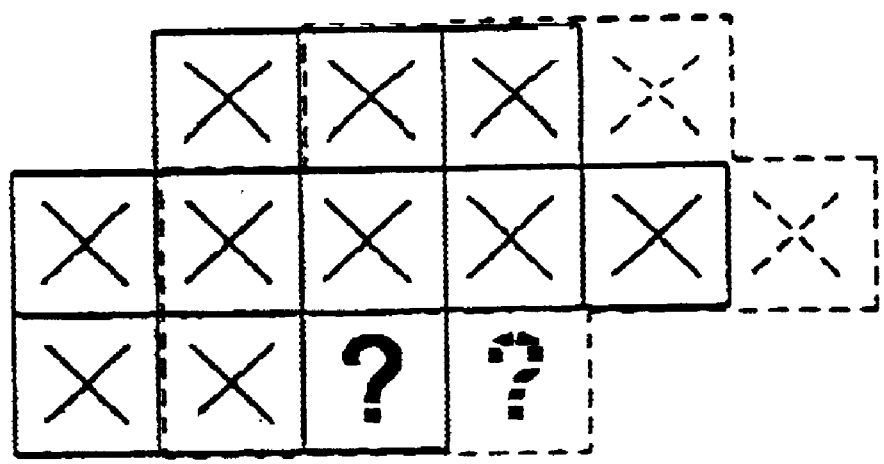
FIG. 20 illustrates an arithmetic coding template according to JBIG.

Even if renormalization occurs and the RAM needs to be updated, when the next context (placement of 1 and 0 in the reference pixels when the template in FIG. 20 is shifted rightward) is different from the previous one, this allows a read of coding context information and an update (write) of the context information when renormalization occurs to be performed simultaneously in a same cycle.

Therefore, even if renormalization occurs, if the next context is different, no contention occurs in accesses to the ROM, and therefore it is not necessary to wait for an overwrite and no disturbance occurs in the pipeline.

The output signals of the context RAM include a predicted value MPS (S) of the symbol to be coded and state number (state No in the figure) of the probability estimator. The predicted value MPS (S) is sent to arithmetic code calculator 703 through delay adjustment circuit 711 of the pipeline.

These two output signals are input to selector 704 and 705. When renormalization does not occur, control circuit 709 controls selector 704 and 705 so that the signal on the upside (that is, MPS value and state number output from the context RAM) is selected.

Qe ROM 702 is accessed using the state number input via selector 705 as an address variable.

As shown in FIG. 5, since three types of Qe are listed as one address of Qe ROM 702, three types of values are always output from QeROM 702 as the probability estimates. Then, control circuit 709 decides whether renormalization occurs or not, or whether the context continues or not and selects either one of those choices in real time.

An operation when renormalization occurs will be explained using FIG. 6 below.

Figure 6:
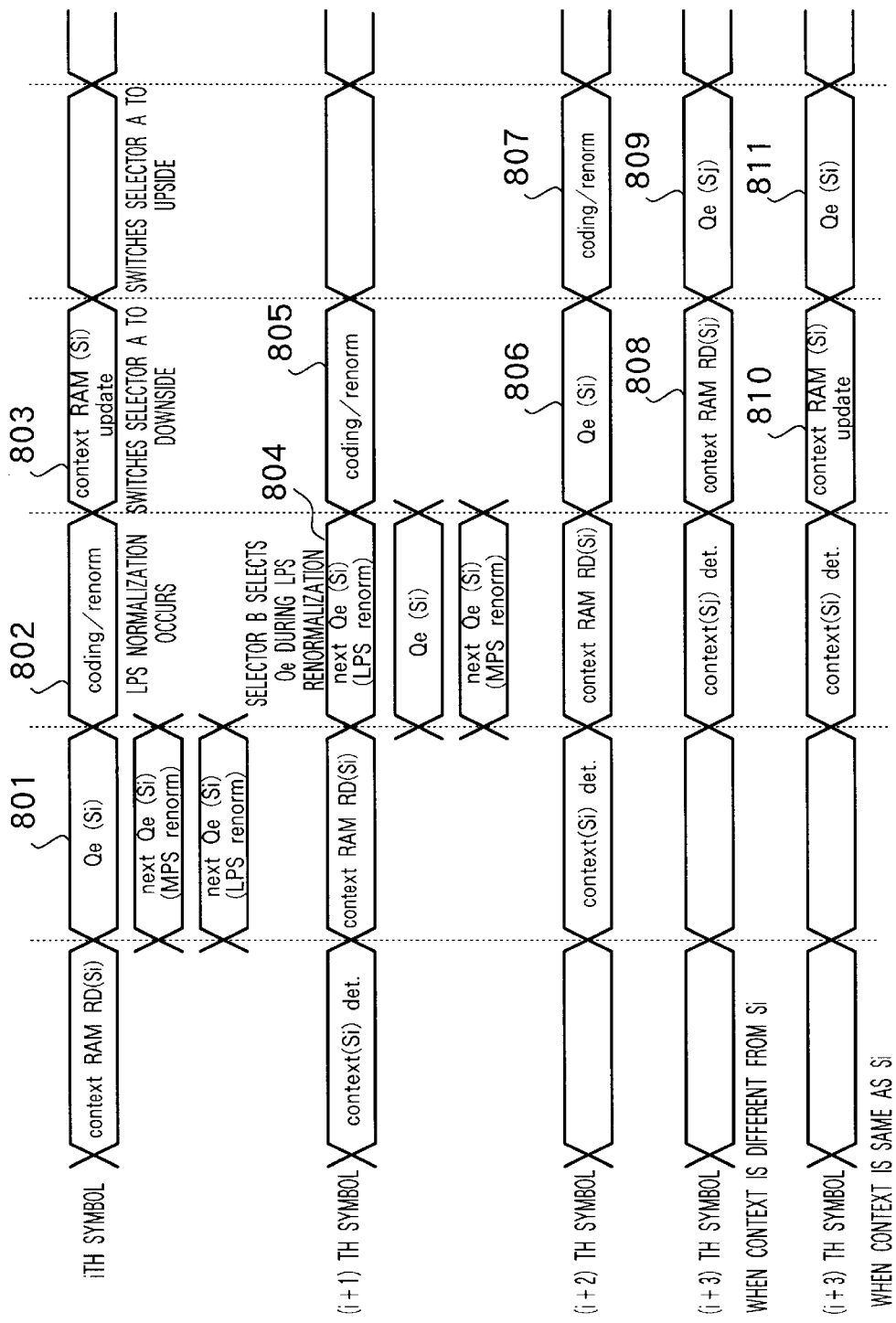
FIG. 6 is a timing chart to illustrate a pipeline operation of the arithmetic coder in FIG. 4.
Figure 7:
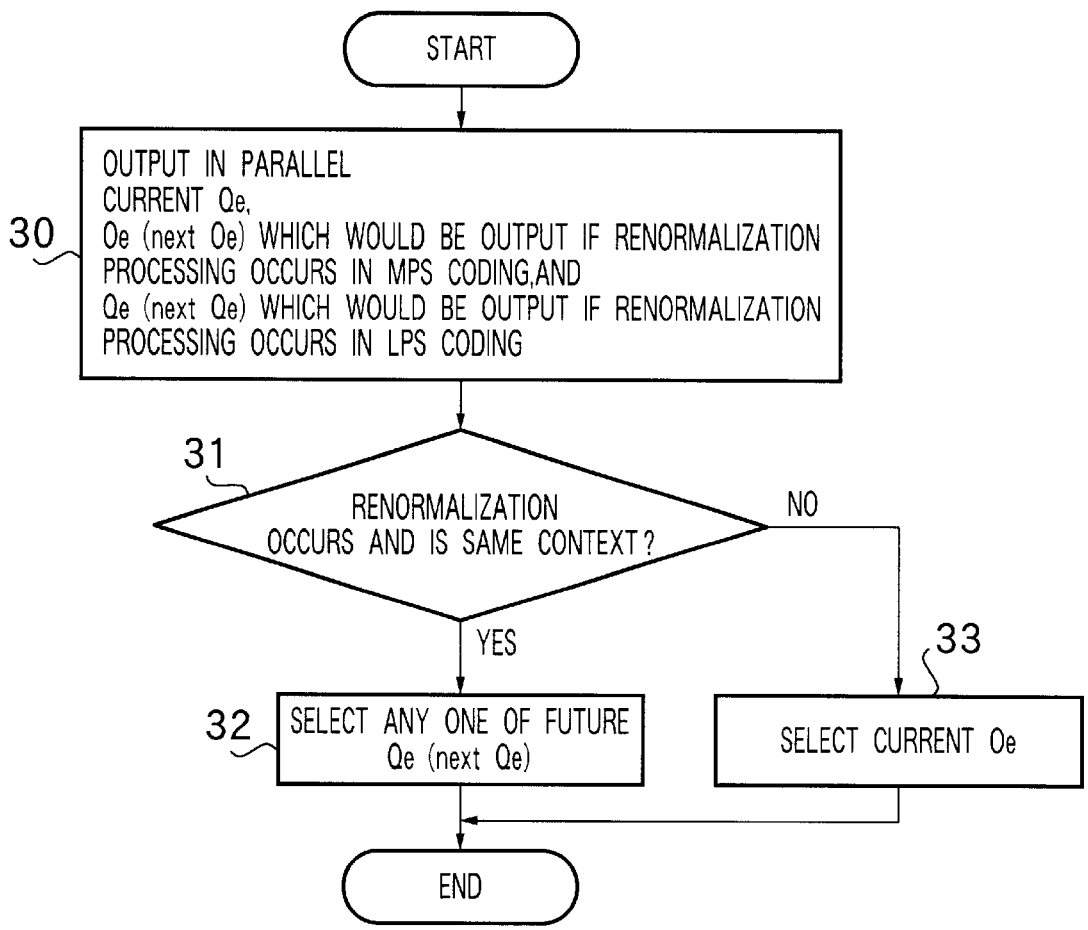
FIG. 7 is a flow chart to illustrate a characteristic operation of the arithmetic coder in FIG. 4.

In FIG. 6, suppose Qe(Si) (signal 713) is selected in process 801. Here, the ith context is assumed to be Si.

In process 802, coding calculation of the ith symbol and renormalization are performed. Here, suppose LPS is coded and renormalization occurs.

On the (i+1)th symbol, a read from Qe ROM 702 is executed in the same cycle as for the coding calculation of the ith symbol (process 804).

Suppose the context of the (i+1)th symbol is also Si. Then, since LPS renormalization occurs with the ith symbol, selector 706 selects Qe value 714 which is the probability estimate of the transition state with LPS renormalization.

In process 805, a coding calculation using this value is performed. At this time, the content of context Si of context RAM 701 is updated in process 803.

The updating process is performed as follows. That is, selector 707 selects next state number 716 during LPS renormalization. On the other hand, EOR circuit 708 creates a new predicted value (signal 721) from switch-MPS (signal 718) and the current predicted value MPS (Si) (signal 723).

If signal 718 is "1" as described above, the value of MPS (Si) is inverted. These two pieces of information are written at address Si of context RAM 701.

At this time, address Si is output from delay circuit 712 as signal 724. It is necessary to read Qe ROM 702 for the (i+2)th symbol at the timing of this updating process.

As this time, if the (i+2)th symbol is also the same context Si, then selectors 704 and 705 are controlled so that the downside signal is selected. This is because renormalization may recur in process 805 as described above. When updating of the context information of Si is completed, selectors 704 and 705 select the upside signal.

For the (i+3)th symbol, a read from the context RAM is performed in this cycle (process 808). As explained above, if the context of the (i+3)th symbol is different from Si and is Sj, a context read from dual port ROM 701 and an update of context Si are performed simultaneously.

If the context of the (i+3)th symbol is Si, the content is updated in process 803. At this time, selectors 704 and 705 select the downside signal.

As shown above, even if coding is performed consecutively with contexts in which renormalization occurs, no invalid cycle occurs and no disturbance occurs in the pipeline as in the case of the conventional example. Thus, it is possible to code one symbol per one clock consecutively for any image patterns.

The main coding procedure of the present invention described above will be summarized in FIG. 7.

That is, current Qe and Qe (next Qe) which would be output when renormalization occurs in MPS coding and Qe (next Qe) which would be output when renormalization occurs in LPS coding are output in parallel (step 30).

Then, when renormalization occurs and the next context is also the same (step 31), either one of future Qe (next Qe) is selected according to whether it is renormalization by MPS coding or renormalization by LPS coding (step 32). When no renormalization occurs, current Qe is selected (step 33).

In the case of decoding, it is also possible to pipeline arithmetic decoding processing by adopting a technique of inputting or outputting information necessary to reconstruct symbols one to three steps ahead in parallel while the current symbol is being reconstructed and selecting, when the reconstruction result is revealed, any one of the outputs according to the result.

However, when renormalization occurs in the same way as coding and the contexts continue, disturbance occurs in the pipeline.

Thus, as in the case of coding, a system is adopted which outputs current Qe and updated Qe in parallel and selects either one according to the actual decoding result.

Figure 21:
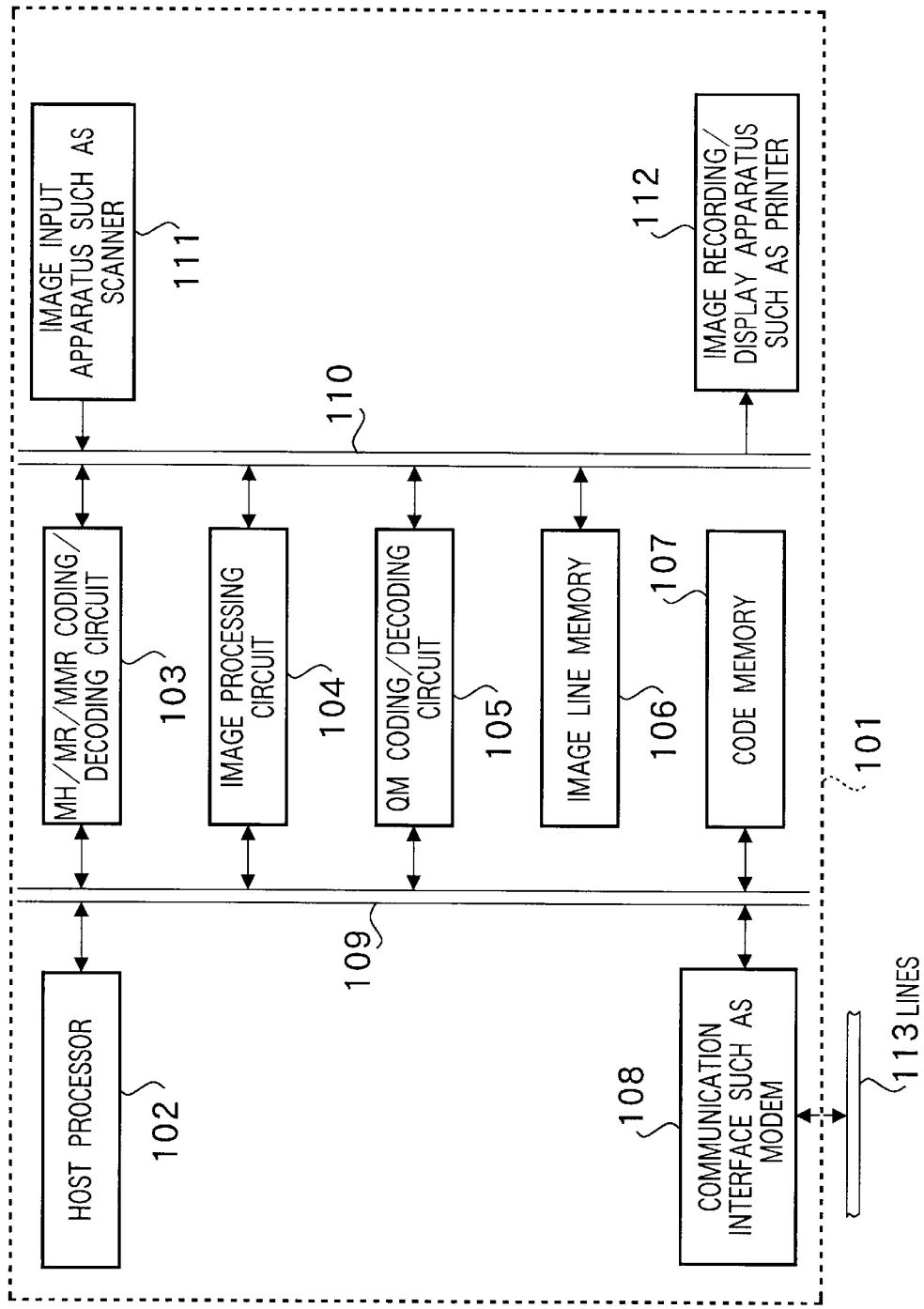
FIG. 21 is a block diagram showing a configuration of an image processing apparatus incorporating the arithmetic coding apparatus of the present invention.

The arithmetic coder/decoder of the present invention explained above is suited to be mounted on the multifunctional peripheral (apparatus having functions of a scanner, facsimile apparatus and copier together) as shown in FIG. 21.

That is, using the QM-coder for applications of reading images and temporarily storing in memory, for example, a scanner, FAX and multi-functional peripheral requires high-speed processing together with speeding up of the scanner or printer.

Use of the present invention allows extremely fast coding/decoding on any image without disturbance in the pipeline processing.

The multi-functional peripheral in FIG. 21 comprises host processor 102, coding circuit 103 such as MH, image processing circuit 104, QM coding/decoding circuit 105, image line memory 106, code memory 107, communication interface 108 such as a modem, image input apparatus 111 such as a scanner and image recording/display apparatus 112 such as a printer.

The arithmetic coder/decoder of the present invention is mounted on QM coding/decoding circuit 105.

(Arithmetic Coding Processing of Multi-valued Image)

Figure 10:
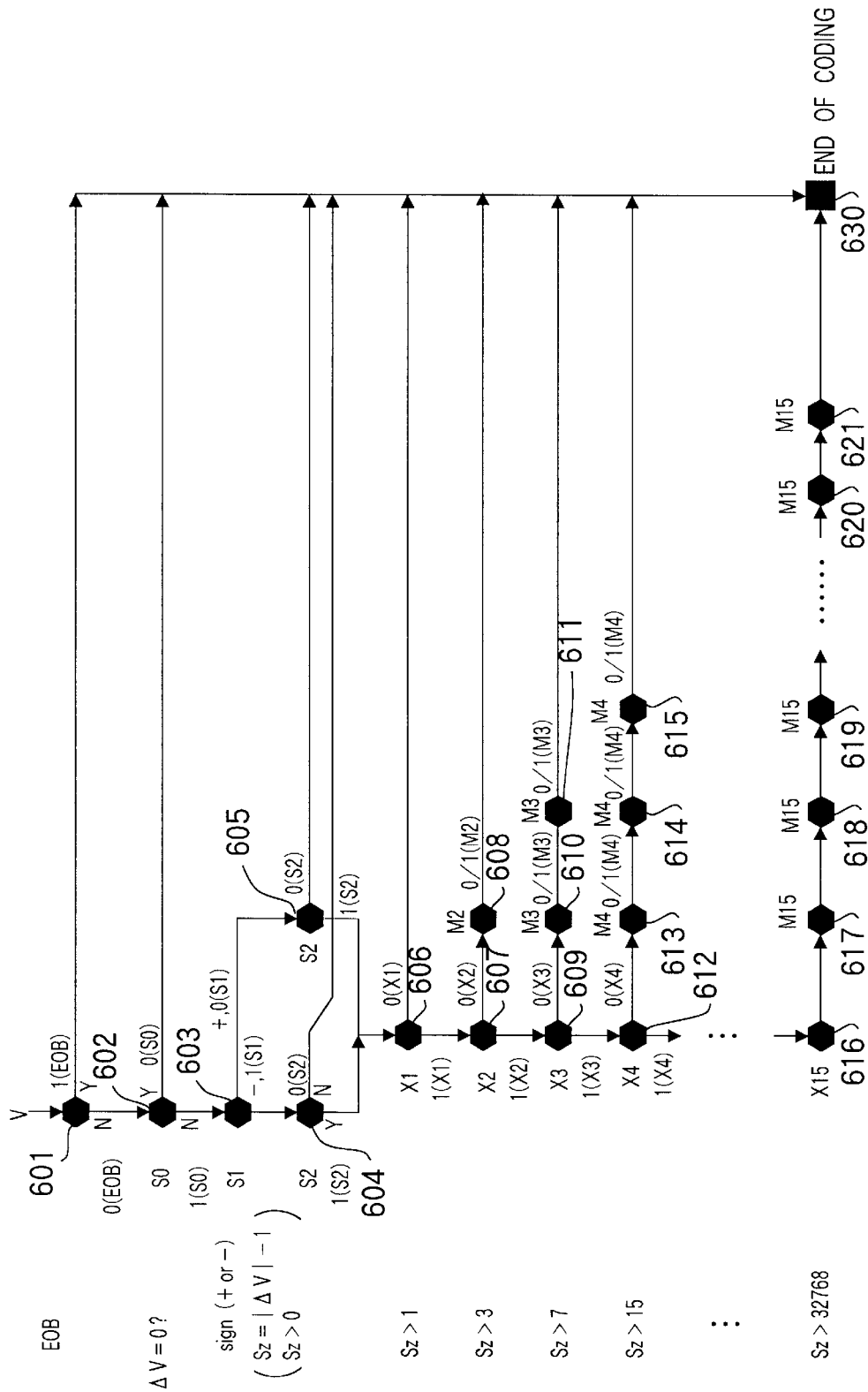
FIG. 10 illustrates a procedure for processing of decomposing multi-valued data into binary data and generating symbols to be coded in the present invention.

In the case of a multi-valued image, the multi-valued image is decomposed into binary information using a unified procedure as shown in FIG. 10 and this binary information is subjected to arithmetic coding.

The basics of the binary decomposition processing consist of preparing a plurality of questions (decision items) whose order is preset, questioning, when data is input, in the order in which the data is input, branching with "yes" or "no" and expressing the branch with "1" or "0".

In this way, binary symbols subject to arithmetic coding are generated. If the decoding side knows beforehand what kind of questions (decisions) are made in which order, it is possible to decode the code.

The problem here is how the context should be made when the coded symbol obtained by binary decomposition is subjected to arithmetic coding.

That is, there is a problem as to how the context for multi-valued data coding is generated.

A DCT transformation coefficient consists of a DC component and AC component and these two have different natures, and therefore it is conventionally believed that a DC component context and AC component context need to be set independently of each other.

Figures 9A, 9B:
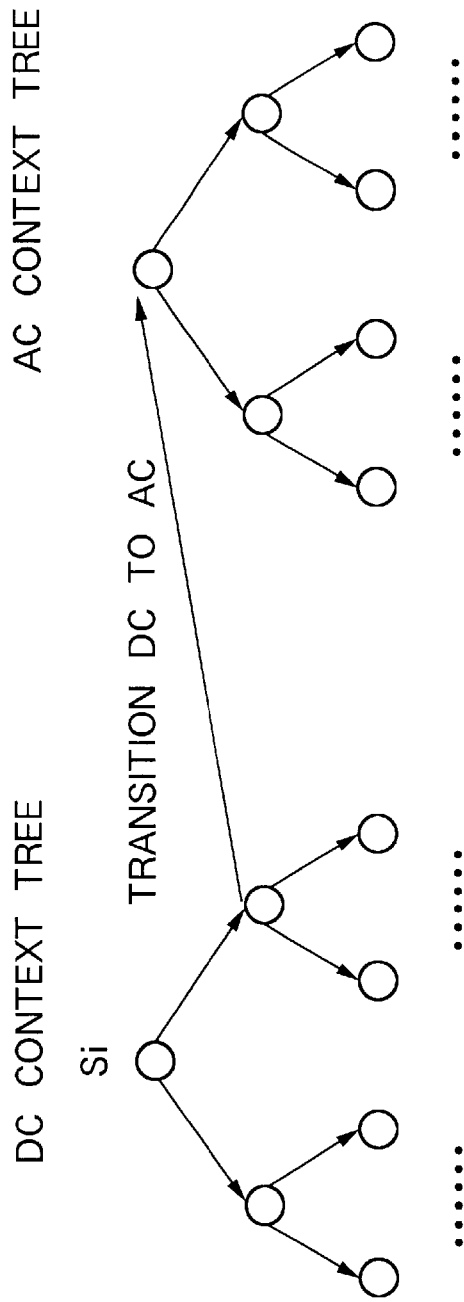
FIG. 9A illustrates switching between a DC component context and AC component context in a conventional example.
FIG. 9B illustrates transition from a DC component context tree to an AC component context tree in the conventional example.

That is, to switch between contexts as shown in FIG. 9A, it is necessary to decide the boundary between the binary data of the DC component (or AC component) and the binary data of the next DC component (or AC component).

Then, as shown in FIG. 9B, when contexts are generated, it is necessary to transition from the DC context tree to the AC context tree.

Therefore, when data is reconstructed, it is necessary to decide the end of the DC component/AC component every time one symbol is reconstructed and it takes at least two cycles per one symbol, which would make it impossible to perform complete pipeline processing which completes processing in one clock.

Furthermore, when there is a plurality of context models, it is inevitable to adopt a circuit configuration that starts the pipeline from the initial state on the boundary between the DC component and AC component.

High-speed processing is not expected from such a decoder. Furthermore, such a circuit configuration having a DC context and AC context results in a large circuit configuration, complicating control between components with different contexts.

Thus, the present invention assigns a common context to both component data without distinguishing between the DC component and AC component.

This transforms the context tree into one unified tree as shown in FIG. 8. In this case, though compressibility deteriorates slightly, the process to decide the end of the DC component/AC component is completely unnecessary as shown in FIG. 9(a).

Figures 8A, 8B:
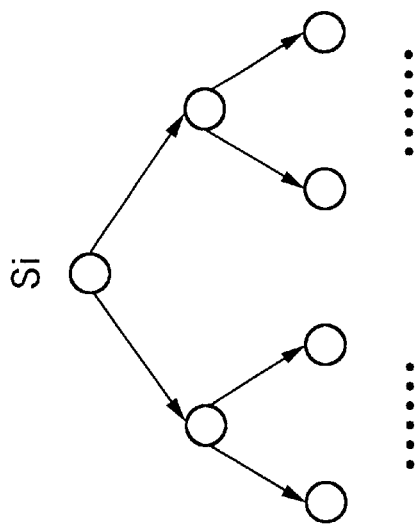
FIG. 8A illustrates switching between a DC component context and AC component context in the present invention.
FIG. 8B illustrates a tree of a unified context in the present invention.

That is, it is no longer necessary to decide the boundary between the DC component and AC component as shown in FIG. 9A and it is possible to create contexts consecutively as shown in FIG. 8A.

Thus, even if a common context is used, the present invention acquires layered image information with high accuracy and compresses the layered image information with extremely high accuracy, and therefore there is no problem with the quality of a reconstructed image.

A specific example of binary decomposition of multi-valued image information will be explained using FIG. 10.

First, it is examined whether difference data $\Delta V$ (difference between adjacent block DCT coefficients) is EOB (means that all data of a frequency component block containing DC and AC components is zero) or not (step 601). The result is coded.

If the result is yes, "1" is coded with a context expressed with an index "EOB" and coding is completed. Coding of the context in which "1" is expressed with an index "EOB" is described as 1(EOB) in the figure.

On the other hand, if difference data $\Delta V$ is not EOB in step 601, "0" is coded with a context expressed with an index "EOB". This is described as 0(EOB) in the figure. This same notation will be used hereafter.

Thus, a decision is made in each step and when there are two outputs, the right side shows coding with a decision "yes" and the downside shows coding with a decision "no".

Therefore, as described above if difference data $\Delta V$ is EOB in step 601, 1 is coded with context EOB and coding is completed. Otherwise, 0 is coded with context EOB.

Then, in step 602, it is decided whether difference data $\Delta V$ (V) is zero or not. The decision is coded with context "S0". If $\Delta V$ (V) is zero, coding is completed at this point and the next numerical value is coded. If $\Delta V$ (V) is not zero, the process moves on to step 603 where a positive or negative (+ or −) sign is coded. The context at this time is "S1".

Then, the process moves on to step 604 or 605.

In this step 604, it is decided whether the absolute value of difference $\Delta V$ is greater than "1" or not. That is, it is decided whether Sz>0 or not and the result is coded with context S2.

If $\Delta V$ is not "1", it is decided in step 606 whether the absolute value of $\Delta V$ is greater than "2" or not.

That is, it is decided whether Sz>1 or not and the result is coded with context X1.

If Sz>1 (the absolute value of $\Delta V$ is "2") is not the case, it is decided in step 607 whether the absolute value of $\Delta V$ is "3" or "4" or greater than "4".

That is, it is decided whether Sz>3 or not and the result is coded with context X2.

Here, if Sz=2, in step 608, "0" of the lower bit of binary notation "10" of 2 is coded with context M2.

When Sz=3, in step 608, "1" of the lower bit of binary notation "11" of 2 is coded with context M2 likewise.

In step 609, it is decided whether Sz>7 or not and the result is coded with context X3.

Here, when Sz is 4 to 7, the lower 2 bits "00", "01", "10" and "11" of binary notation "100", "101", "110" and "111" of 4, 5, 6 and 7 are coded with context M3 (steps 610 and 611).

In step 612, it is decided whether Sz>15 or not and the result is coded with context X4.

In the case where Sz=8 to 15 at this time, the respective numerical values are binary-notated and the lower 3 bits are coded with context M4.

When the input value of difference data ΔV is greater, the same process will be repeatedly performed thereafter.

In step 616, it is decided whether Sz>32768 or not and the result is coded with context X15. When Sz≦32768, each numerical value is binary-notated and several lower bits are coed with context M15.

In the above explanations, X1 to X15 are contexts for coding data indicating the magnitude category of Sz and M2 to M15 are contexts for coding the magnitude bit of Sz.

In the above-described order, multi-valued image information is binarized and the decomposed binary data becomes the target symbol for arithmetic coding.

Figure 11A:
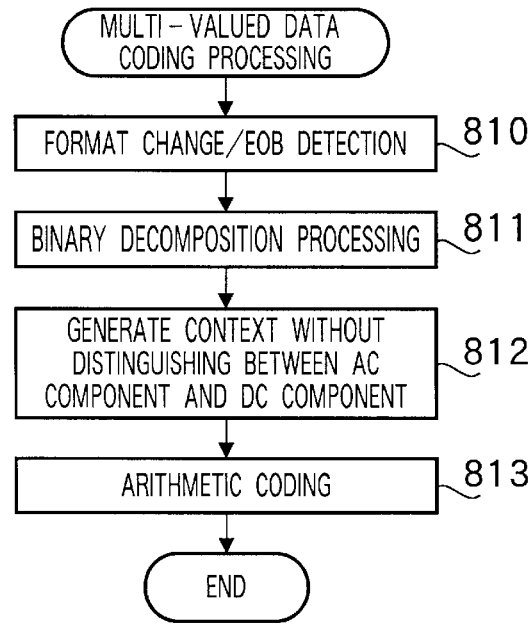
FIG. 11A is a flow chart showing a procedure for coding of multi-valued data.

The overall procedure for arithmetic coding of multi-valued data is summarized as shown in FIG. 11A.

That is, format transformation and detection of EOB are performed first (step 810). Then, binary decomposition processing is performed (step 811) and contexts are created without distinguishing between AC components and DC components (steps 812). Then, arithmetic coding processing is performed (step 813).

Figure 11B:
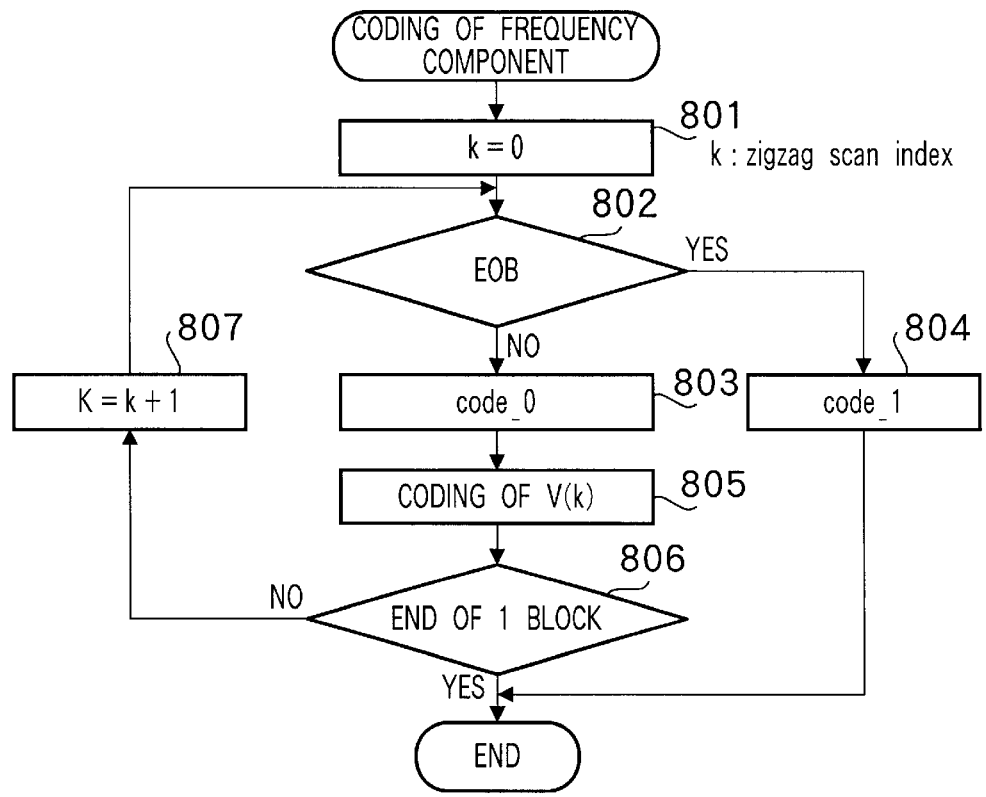
FIG. 11B is a flow chart showing a procedure for coding of frequency components.

Arithmetic coding of a frequency component is carried out using the procedure shown in FIG. 11B. Here, k denotes an index of zigzag scan order.

First, suppose k=0 (step 801). Then, it is decided whether the value of k=0 expresses an EOB symbol or not (step 802).

Here, if the decision is EOB when k=0, this means that both the DC component and AC component are zero.

If the decision is EOB, 1 is coded (code-1) in step 804 and coding of the block is completed.

If the decision is not EOB, 0 is coded in step 803 and ΔV (V) is coded in step 805.

If one block is not completed in the decision in step 806, the index is updated in step 807 and the same process is repeated.

Coding of one block is completed in this way. Though not shown here, if there is information to be coded as a DC component in addition to the frequency component, that information is coded first.

In this embodiment, the DC component and AC component are coded in this order.

A specific example of arithmetic coding has been explained so far. Next, fixed-length processing on codes will be explained.

(Content of Fixed-length Processing on Code)

With reference to FIG. 12 to FIG. 16, processing of arranging the code length of one block to a fixed size will be explained.

Figure 12A:
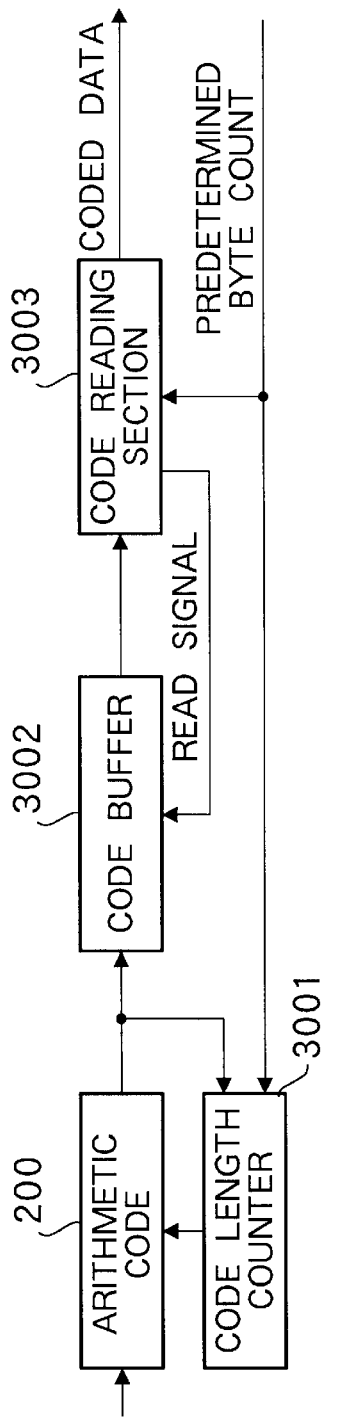
FIG. 12A is a block diagram showing a configuration of a circuit that arranges the code length of one block to a predetermined size.

FIG. 12A is a block diagram showing a configuration of a circuit for arranging the code length of one block to a fixed size (having the same configuration as that of the circuit shown in FIG. 3).

A code output from arithmetic coder 200 is temporarily stored in code buffer 3002 provided inside fixed-length processing section 300. This code buffer 3002 is cleared to all zeros prior to coding of one block.

Code reading section 3003 reads data from code buffer 3002 every time codes corresponding to a predetermined number of bytes (codes of one block) are stored.

When the code length falls short of the predetermined number of bytes, data to which zero, the initial value of code buffer 3002, is added at the end of the code is automatically read.

Therefore, troublesome processing such as intentionally inserting zero and fixing the code length is unnecessary.

The code length counter accumulates the code length of each block and detects whether the accumulated value reaches the predetermined number of bytes or not, and instructs arithmetic code calculator 1004 to end the coding.

Figure 12B:
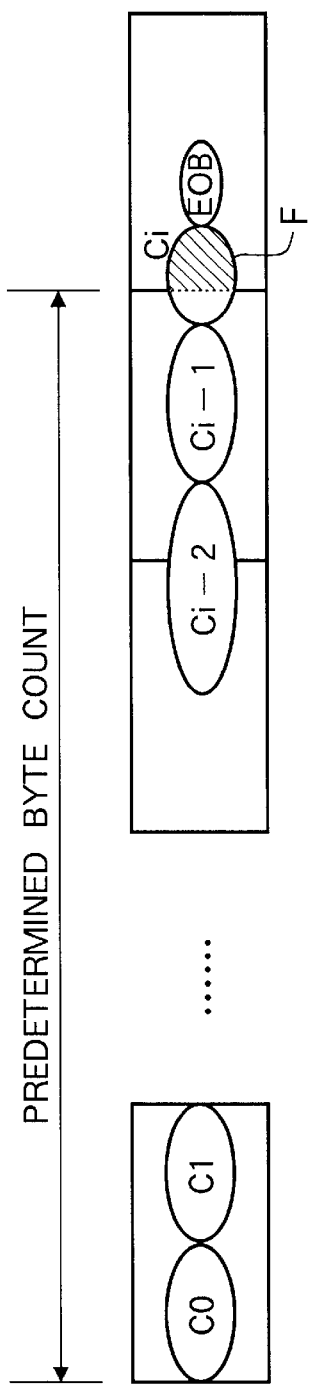
FIG. 12B illustrates an increase of the code length when a complicated multi-valued image is coded.
Figure 12C:
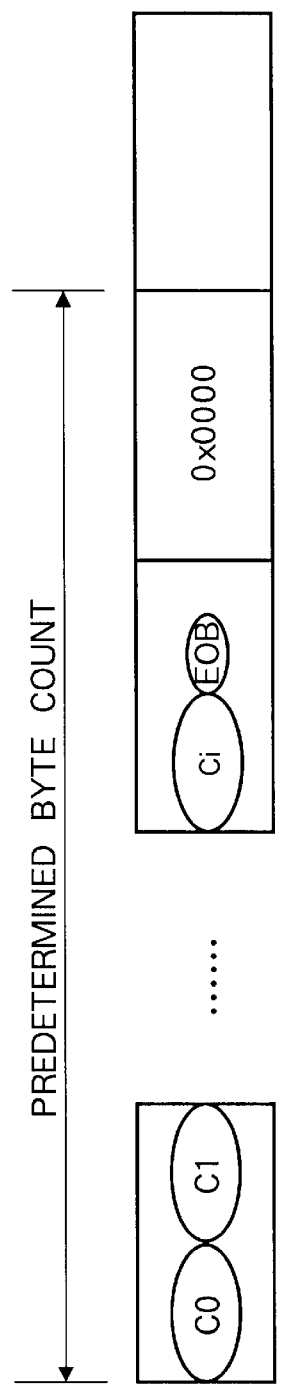
FIG. 12C illustrates an increase of the code length when a simple multi-valued image is coded.

FIG. 12B and FIG. 12C show examples of the code stream when a DCT coefficient on one block is coded.

As shown in FIG. 12B, when the total code length exceeds the predetermined number of bytes at some midpoint of coding, an EOB is added and the coding process is discontinued and coded data byte of the predetermined size is read. The portion that sticks out from the border (F: hatched area in the figure) of code ci corresponding to the last DCT transformation coefficient to be sent is discarded.

On the other hand, as shown in FIG. 12C, when the total code length fits within the predetermined number of bytes, zeros are automatically padded at the end (zeros which are the initial data of code buffer 3002 are inserted) and codes corresponding to the predetermined number of bytes are read.

Then, the arithmetic coding procedure including the processing of fixing the code length will be explained with reference to FIG. 13.

First, code buffer 207 is cleared prior to coding of the block (step 501).

Then, context memory 204 and the register of arithmetic coder 206 are cleared in process 502. Instead of clearing the context memory, the initial value may be set with training data in order to advance the learning effect of the probability estimator inside the arithmetic coder.

Then, it is decided whether EOB is added or not (step 503).

Then, it is decided whether the number of code bytes exceeds a predetermined value or not (step 504). If the number of code bytes falls short of the predetermined value, the coefficient is coded (step 505). In this case, the number of coding bytes is counted. This process is repeated until coding of 64 DCT coefficients per one block is completed or until a completion condition is satisfied.

When coding is completed, the EOB symbol is coded (FIG. 12B, FIG. 12C), the stored data of the code register of the arithmetic coder is output (step 508) and coding of one block is completed.

Figure 13:
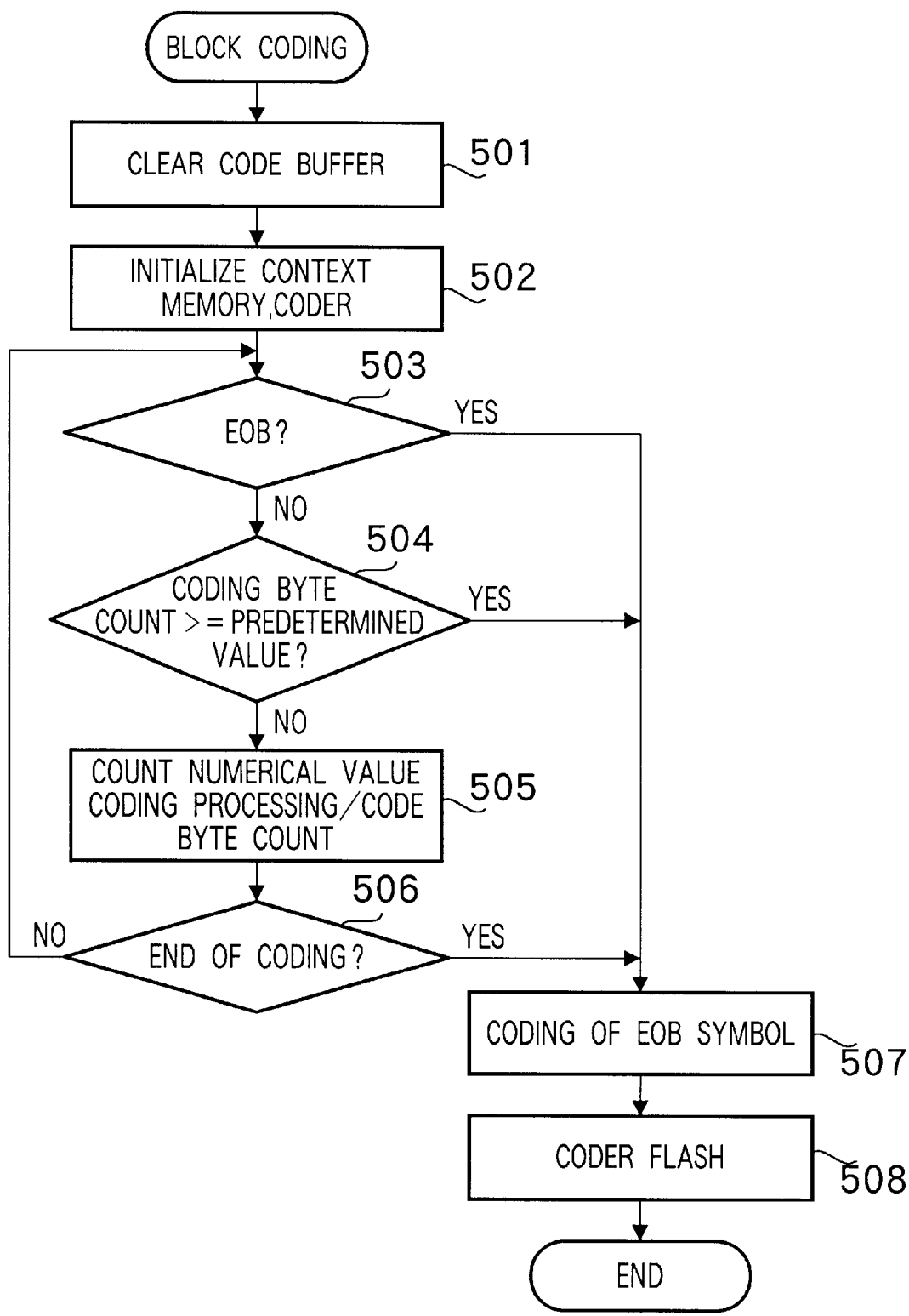
FIG. 13 is a flow chart showing a procedure for coding of one block (including fixed-length processing)

In step 504 in FIG. 13, when the predetermined condition is satisfied, it is for the purpose of speeding up coding that EOB is coded and coding is completed.

These codes are stored in code buffer 3002. Code reading section 3003 reads codes corresponding to a predetermined number of bytes from the start of the buffer from code buffer 3002.

For example, if the predetermined number of bytes is 8 bytes, code bytes B0, . . . , B2 are followed by 0s in a simple image block such as B0; B1; B2; 0; 0; 0; 0; 0. A code in a simple block has about 2 bytes.

On the other hand, in a complicated block, code bytes continue such as B0; B1; B2; B3; B4; B5; B6; B7. Last B7 is discontinued at some midpoint of the code (FIG. 12B, FIG. 12C)

As shown in FIG. 12C, in a simple image, the total code length including EOB information fits within a predetermined number of bytes and zeros are padded thereafter.

In a complicated image block, information at some midpoint of DCT coefficient Ci is not sent to the decoder as a code but discarded (FIG. 12A). In this way, coding of the block of a fixed size using arithmetic codes is performed.

Then, a decoding operation will be explained using FIG. 14 and FIG. 15.

Figure 14:
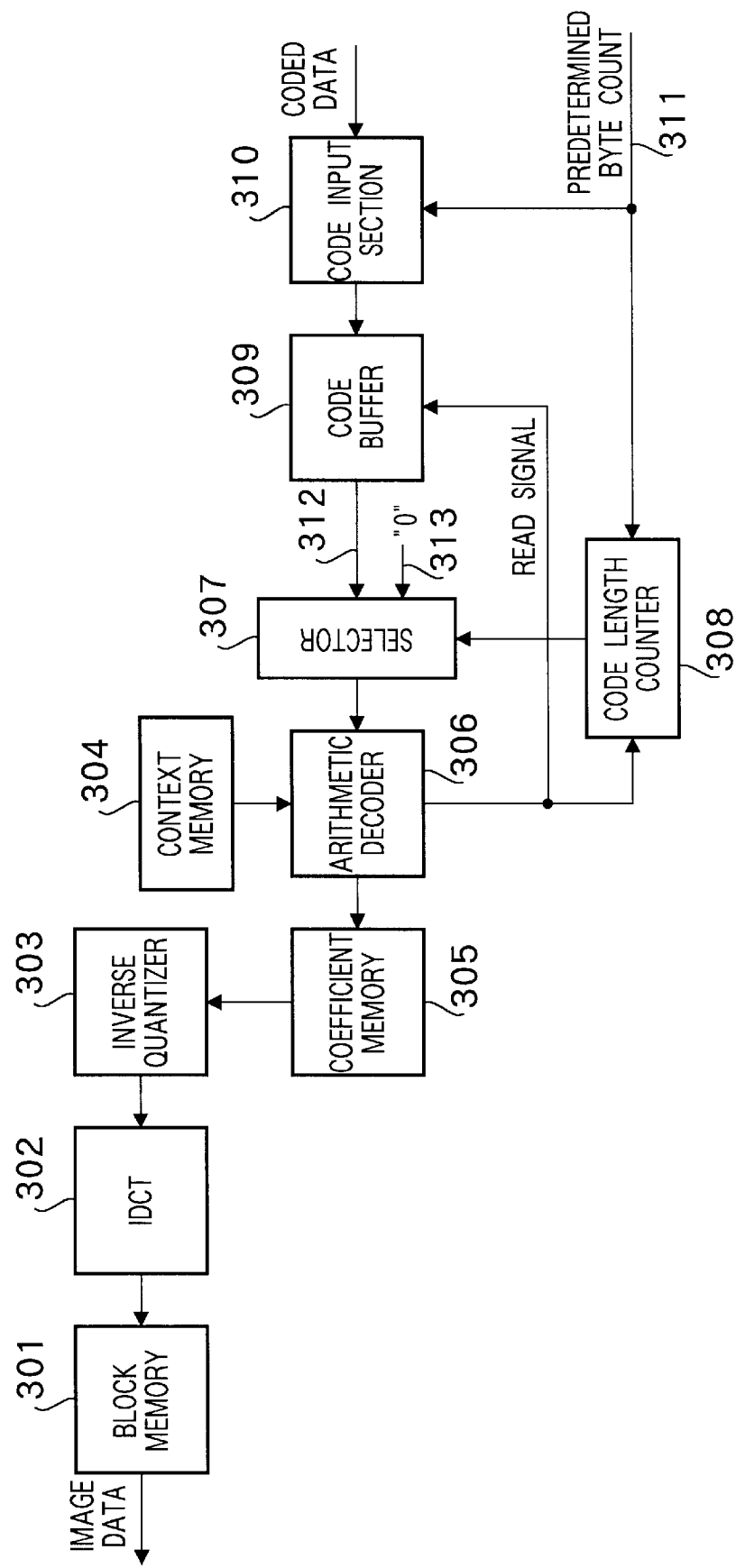
FIG. 14 is a block diagram showing a configuration of an arithmetic decoder for decoding codes subjected to fixed-length processing.

FIG. 14 is a block diagram showing a configuration of a decoder that receives and decodes a code subjected to fixed-length processing.

The following explanation will be focused on parts surrounding the arithmetic decoder.

Coded data with a predetermined number of bytes is input by code input section 310 from an external code memory to code buffer 309. Only codes input to this code buffer are used for one-block decoding. Selector 307 selects whether to input coded data or zeros.

Code length counter 308 counts the number of code bytes read by arithmetic decoder 306 and outputs a selection signal when the number of code bytes exceeds predetermined number of bytes 311 so that selector 307 inputs zero 313 to arithmetic decoder 306.

Arithmetic decoding uses two registers as in the case of coding. One is register C which is a code register and the other is register A indicating the width of a number line. This embodiment assumes that both registers have 16 bits. Through comparisons between these two registers, it is possible to decode symbols.

Figure 16:
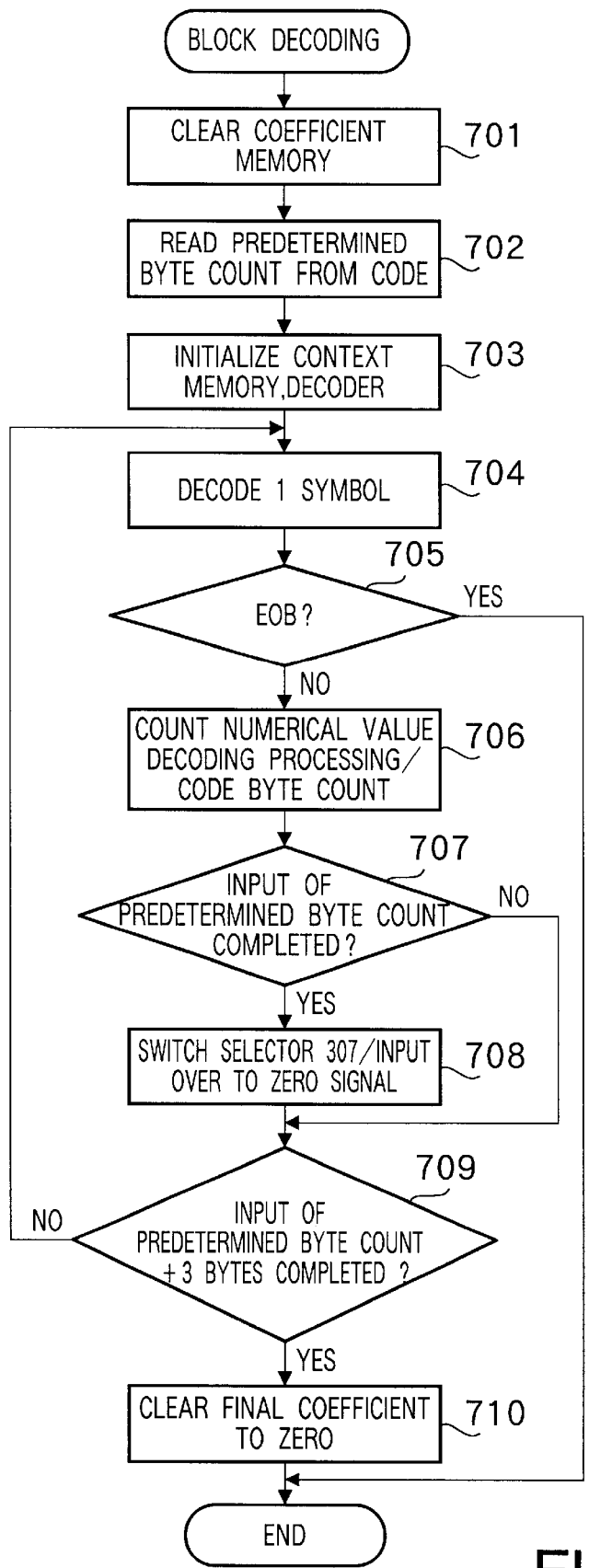
FIG. 16 is a flow chart showing a procedure for a decoding operation of the arithmetic decoder in FIG. 14.

FIG. 16 is a flow chart showing a decoding procedure.

In step 701, coefficient memory 305 is cleared. In step 702, codes of a predetermined number of bytes are input to code buffer 309.

In step 703, context memory 304 and two registers (register C and register A) used for arithmetic decoding are cleared as in the case of coding.

In step 704, a symbol is reconstructed and in step 705, it is decided whether the reconstructed symbol is EOB or not. If not, the numerical value is decoded in step 706.

During symbol decoding, the number of code bytes input is counted. When step 706 is completed, one coefficient can be reconstructed. In step 707, it is decided whether the number of decoded code bytes has reached a predetermined value or not and if so, the input signal of the selector is changed so that zeros are entered to the arithmetic decoder thereafter.

In step 709, it is decided whether the number of code bytes read into register C exceeds a predetermined value by 3 bytes or not. If so, decoding of the predetermined number of bytes is completed.

Since the coded data of the last decoded coefficient is not completed, the final coefficient is regarded as zero in step 710 and decoding of one block is completed.

Figure 15:
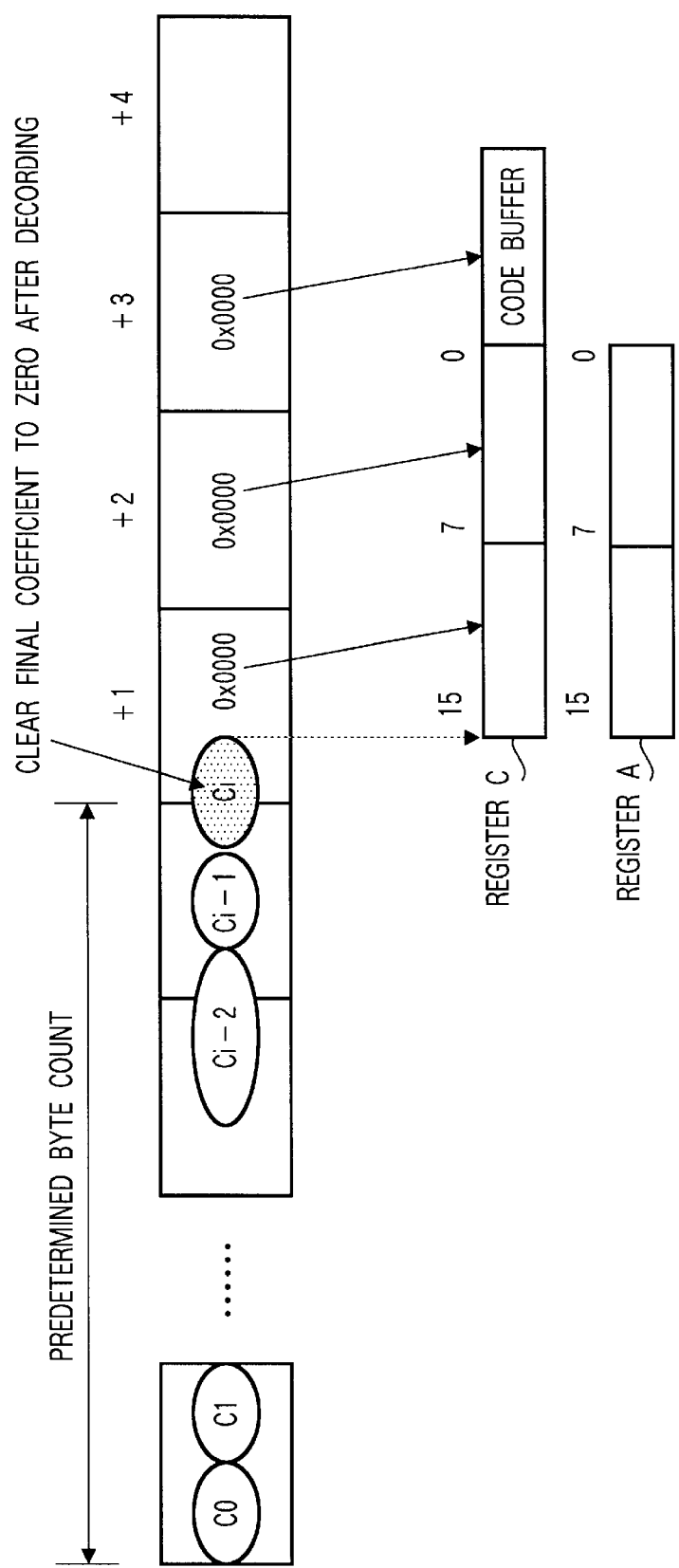
FIG. 15 illustrates a decoding operation of the arithmetic decoder in FIG. 14.

FIG. 15 shows how decoding is performed.

Register C has 16 bits and includes one byte of a code input buffer. Suppose a code of 3 bytes has been read into register C including the code buffer at the start of decoding of the block.

As the symbol is decoded, register C is shifted leftward and a new code byte is read when the code buffer becomes empty.

By the time decoding of coefficient Ci−1 is completed, decoding of all codes has not completed and next coefficient Ci is decoded.

When decoding of coefficient Ci is completed, a predetermined number of bytes plus 3 bytes have been read into the code buffer, which indicates that decoding of a predetermined number of bytes has been completed.

Since the code with the last coefficient Ci is split at some midpoint, this code cannot be decoded correctly. Therefore, the last decoded coefficient is regarded as zero.

(Processing with Color Image)

Figure 17:
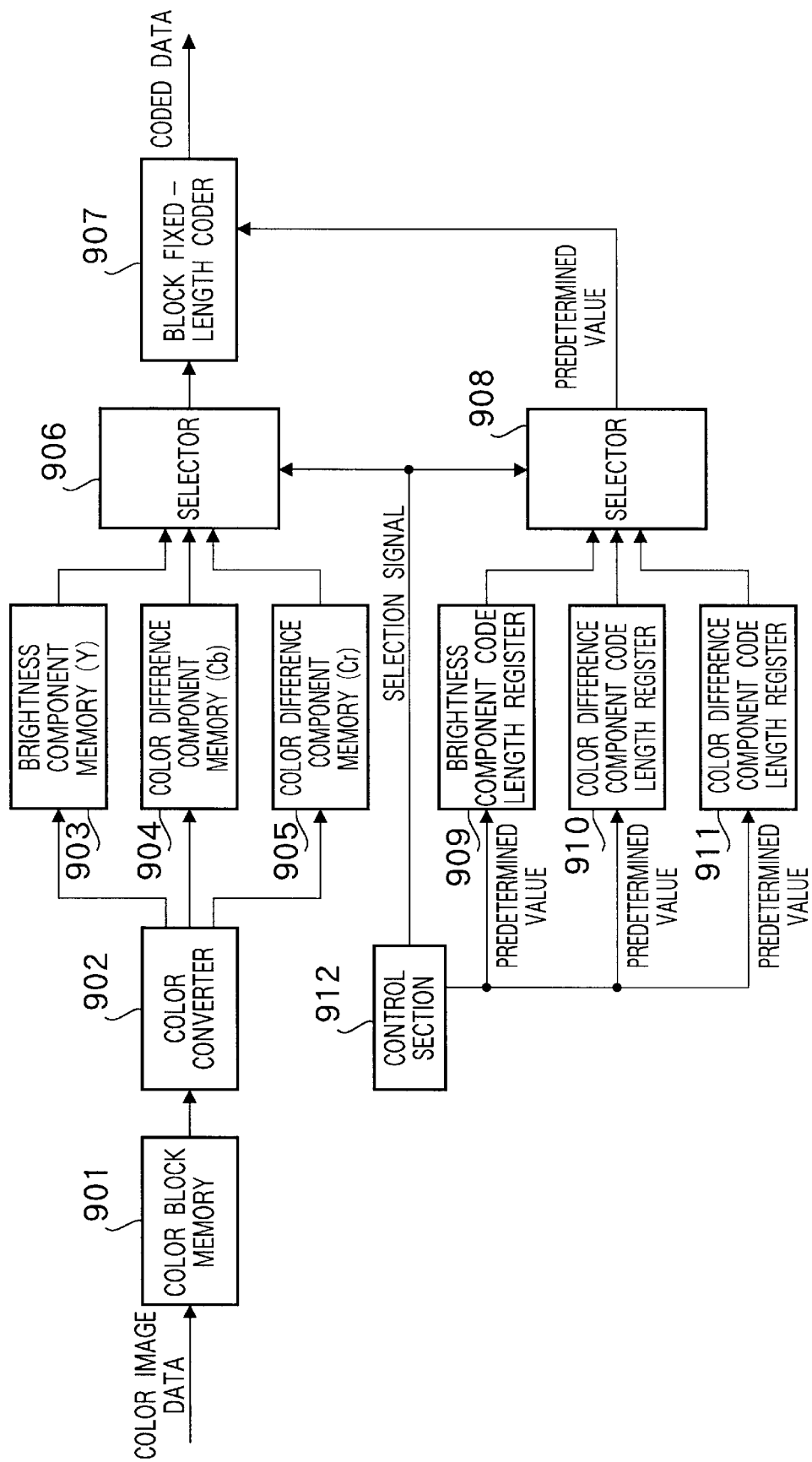
FIG. 17 is a block diagram showing a configuration of a color image processing apparatus incorporating an arithmetic coder with a fixed-length processing function of the present invention.
Figure 18:
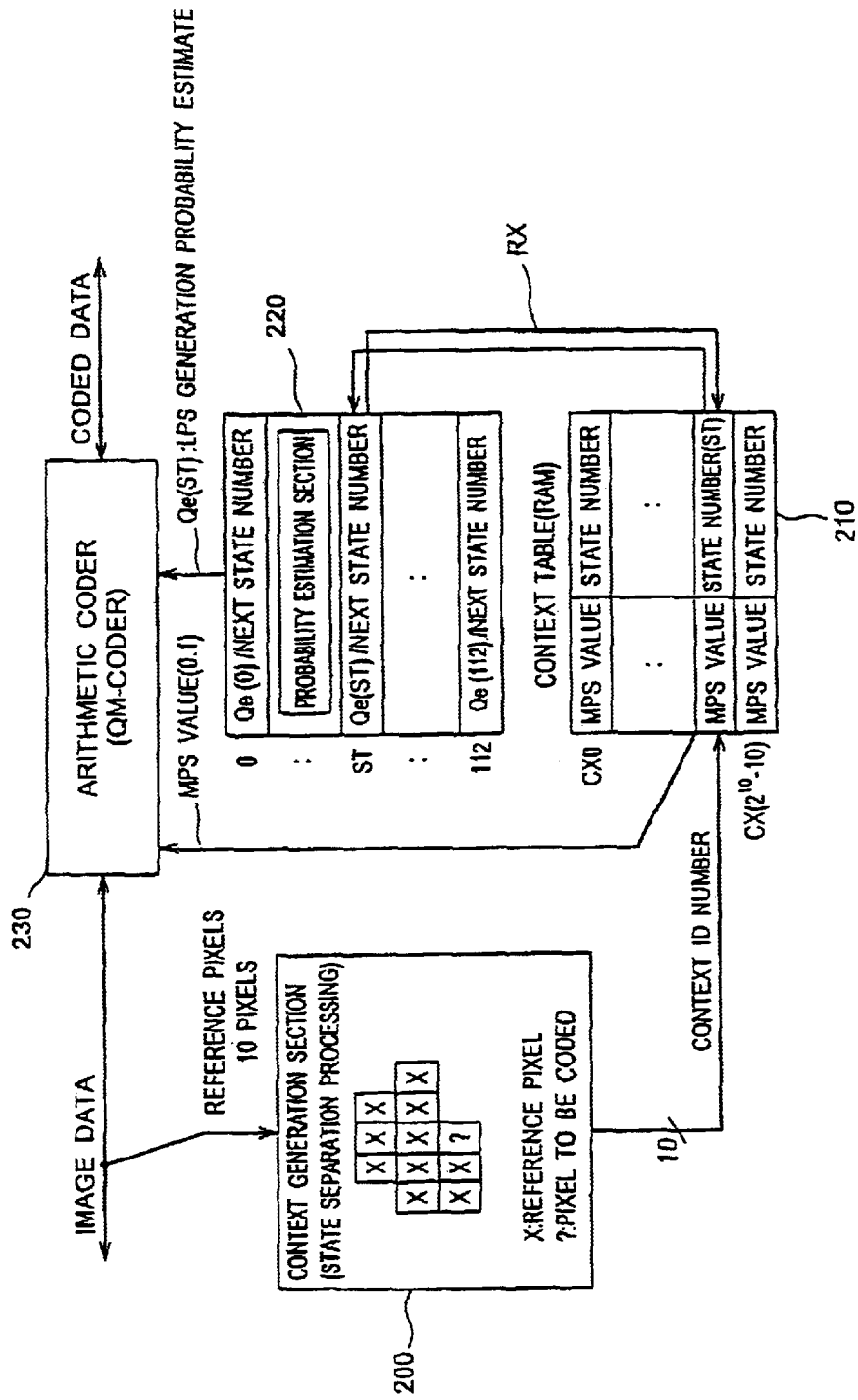
FIG. 18 illustrates a basic configuration of a general arithmetic coder.
Figure 19:
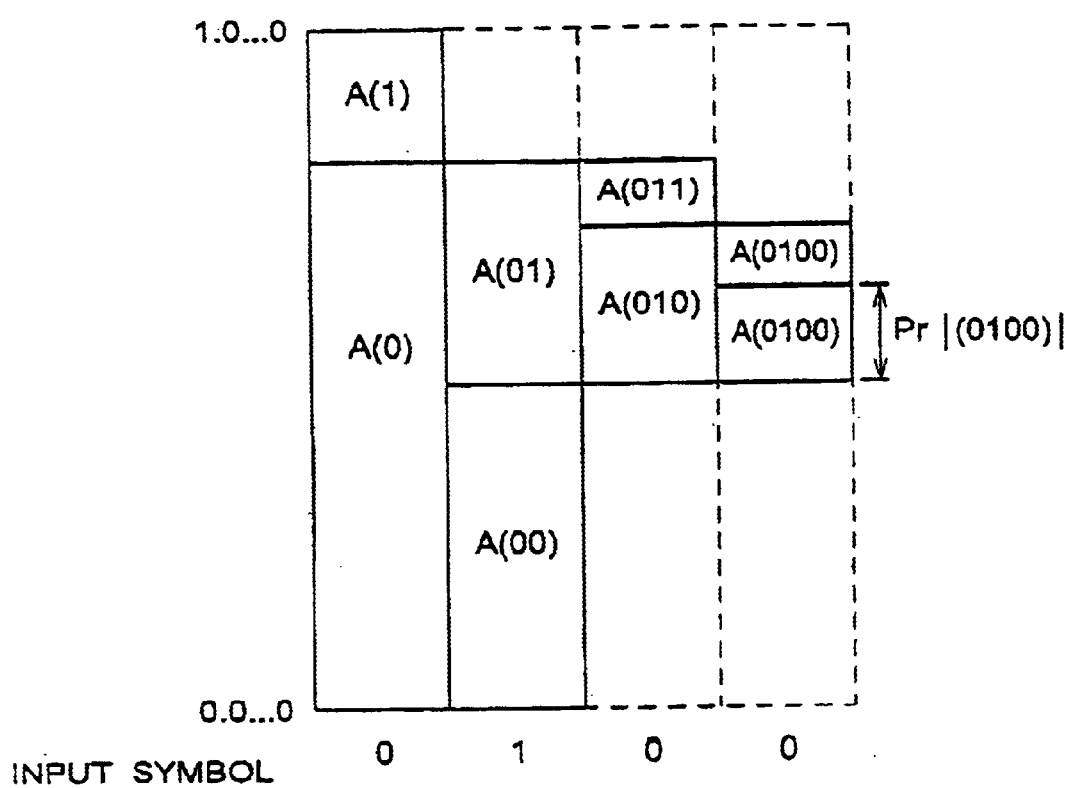
FIG. 19 illustrates principles of arithmetic coding.

FIG. 17 is a block diagram showing a main configuration of a color multi-functional peripheral with a coder having the function of performing fixed-length processing of the present invention.

A color image is split in block (8×8 pixels each) units and each block is stored in color block memory 901.

Color converter 902 separates an RGB color image into brightness and color difference components.

Here, suppose a YCbCr color space. The decomposed color components are stored in memories 903 to 905 respectively.

Normally, the color difference component is a slow-curved signal and has less amount of information than the brightness component. Thus, suppose the brightness component and color difference component are compressed to different code lengths.

Registers 909 to 911 are the registers to set a predetermined number of bytes of the brightness component and color difference component. These values are set by control section 912. Reference numeral 907 denotes an arithmetic coder with a block fixed-length processing function.

Selector 906 and selector 908 supply color components and the respective numbers of coding bytes to coder 907. A selection signal of the selector is output from control section 912.

With this configuration, it is possible to freely combine the numbers of code bytes such as (Y, Cb, Cr)=(8, 4, 4) bytes and (Y, Cb, Cr)=(12, 2, 2) bytes.

Since each block has a fixed size, partial decoding can be easily performed. Furthermore, rotation processing can be done with the same coded data without reconstructing one page, thus providing an easy way of image editing.

Furthermore, memory costs can also be reduced. Furthermore, selecting a code length also makes it easier to adjust the image quality.

The foregoing embodiments assume that an image block has 8×8 pixels each, which is set to be equal to the DCT transformation size, but it is also possible to take the size of the image block as big as 32×32 pixels each. This allows arithmetic codes having a learning function to increase the compression performance, increasing the image quality.

Thus, having a functional block that arranges a code length to a predetermined size makes it possible to output codes of a certain size for each image block of a predetermined size.

Here, the code to compress the image block is a variable-length code with high efficiency and can implement higher image quality than the prior art.

Moreover, since it is possible to change the code length of a block, it is easy to adjust the image quality, allowing image editing with smaller memory in association with image processing of a digital multi-functional peripheral.

As explained above, the present invention can perform arithmetic coding and arithmetic decoding at a limit speed almost determined by an arithmetic coding algorithm.

Furthermore, the present invention can perform coding and decoding using common contexts without distinguishing between bi-level images and multi-valued images, and can thereby simplify the configuration of a coder or decoder considerably.

Furthermore, the present invention arranges the code length of one block (processing unit) to a predetermined length, making it easier to edit a reconstructed image in block units.

The present invention is not limited to the above described embodiments, and various variations and modifications may be possible without departing from the scope of the present invention.

This application is based on the Japanese Patent Application No. 2001-047068 filed on Feb. 22, 2001, Japanese Patent Application No. 2000-217850 filed on Jul. 18, 2000 and Application No. 2002-002818 filed on Jan. 9, 2002 entire content of which is expressly incorporated by reference herein.

What is claimed is:

1. An arithmetic coding method for coding multi-valued data, including a common context model in which common undistinguished contexts for both DC components and AC components are stored, the method comprising;

orthogonal transforming multi-valued image data into orthogonal transform coefficients that contain DC components and AC components;

binary decomposing an orthogonal transform coefficient into binary data;

outputting a context corresponding to the binary decomposed data from the common context model; and arithmetic coding the binary decomposed data based on the context corresponding to said binary decomposed data.

2. The arithmetic coding method according to claim 1, wherein said orthogonal transform coefficient includes EOB.

3. The arithmetic coding method according to claim 1, further comprising arranging the orthogonal transform coefficients in an order of low frequency coefficients to high frequency coefficients and starting with a DC component.

4. An arithmetic coding method for coding multi-valued data, including a common context model in which common undistinguished contexts for both DC components and AC components are stored, the method comprising;

orthogonal transforming multi-valued image data into orthogonal transform coefficients that contain DC components and AC components;

binary decomposing an orthogonal transform coefficient into binary data;

outputting a context corresponding to said binary decomposed data from the common context model based on a decision sequence that outputs a corresponding context based on input of said binary decomposed data, said decision sequence having a plurality of decision items, a specific context assigned to each decision item and the plurality of decision items being connected with each other in a single tree structure; and arithmetic coding said binary decomposed data based on said context corresponding to said binary decomposed data.

5. The arithmetic coding method according to claim 4, wherein the decision sequence arranges a plurality of decision items in an order such that the smaller an orthogonal transform coefficient, the faster a context is output.

6. The arithmetic coding method according to claim 4, wherein the orthogonal transform coefficient includes EOB.

7. The arithmetic coding method according to claim 4, further comprising arranging the orthogonal transform coefficients in an order of low frequency coefficients to high frequency coefficients and starting with a DC component.

8. An arithmetic coding apparatus comprising;

a common context model which stores common undistinguished contexts utilized for both DC components and AC components;

an orthogonal transformer that orthogonal transforms multi-valued image data into orthogonal transform coefficients, said orthogonal transform coefficients containing DC components and AC components;

a binary decomposer that decomposes an orthogonal transform coefficient into binary data;

an outputter that output a context corresponding to said binary decomposed data from said common context model; and an arithmetic coder that arithmetic codes said binary decomposed data based on said context corresponding to said binary decomposed data.

9. The arithmetic coding apparatus according to claim 8, wherein said orthogonal transform coefficient includes EOB.

10. The arithmetic coding apparatus according to claim 8, wherein said orthogonal transformer further arranges the orthogonal transform coefficients in an order of low frequency coefficients to high frequency coefficients and starting with a DC component.

11. An arithmetic coding apparatus comprising;

a common context model which stores common undistinguished contexts for both DC components and AC components;

an orthogonal transformer that orthogonal transforms multi-valued image data into orthogonal transform coefficients, said orthogonal transform coefficients containing DC components and AC components;

a binary decomposer that decomposes an orthogonal transform coefficient into binary data;

an outputter that output a context corresponding to said binary decomposed data from said common context model based on a decision sequence that outputs a corresponding context based on input of said binary decomposed data, said decision sequence having a plurality of decision items, a specific context assigned to each decision item and the plurality of decision items being connected with each other in a single tree structure; and an arithmetic coder that arithmetic codes said binary decomposed data based on said context corresponding to said binary decomposed data.

12. The arithmetic coding apparatus according to claim 11, wherein said decision sequence arranges a plurality of decision items in an order such that the smaller an orthogonal transform coefficient, the faster a context is output.

13. The arithmetic coding apparatus according to claim 11, wherein said orthogonal transform coefficient includes EOB.

14. The arithmetic coding apparatus according to claim 11, wherein said orthogonal transformer further arranges the orthogonal transform coefficients in an order of low frequency coefficients to high frequency coefficients and starting with a DC component.

* * * * *